(12) United States Patent
Shigemura et al.

(10) Patent No.: US 7,837,528 B2
(45) Date of Patent: Nov. 23, 2010

(54) EVAPORATION MASK, METHOD OF FABRICATING ORGANIC ELECTROLUMINESCENT DEVICE USING THE SAME, AND ORGANIC ELECTROLUMINESCENT DEVICE

(75) Inventors: Koji Shigemura, Sagamihara (JP); Chang Ho Kang, Yangsan (KR)

(73) Assignee: Samsung Mobile Display Co., Ltd., Yongin-si (KR)

(*) Notice: Subject to any disclaimer, the term of this patent is extended or adjusted under 35 U.S.C. 154(b) by 1593 days.

(21) Appl. No.: 10/718,640

(22) Filed: Nov. 24, 2003

(65) Prior Publication Data
US 2004/0104197 A1    Jun. 3, 2004

(30) Foreign Application Priority Data
Nov. 29, 2002    (JP)    ............... 2002-347977

(51) Int. Cl.
H01J 9/00 (2006.01)
H01J 63/04 (2006.01)
H01J 1/62 (2006.01)
C23C 16/00 (2006.01)
B05C 11/11 (2006.01)

(52) U.S. Cl. ............... 445/24; 445/25; 445/1; 445/23; 427/66; 118/715; 118/721; 118/504; 118/505

(58) Field of Classification Search ............ 445/24; 218/20
See application file for complete search history.

(56) References Cited

U.S. PATENT DOCUMENTS

| | | | |
|---|---|---|---|
| 6,469,439 B2* | 10/2002 | Himeshima et al. | 313/506 |
| 6,858,086 B2* | 2/2005 | Kang | 118/720 |
| 6,893,709 B2* | 5/2005 | Kitazume | 428/192 |
| 7,537,798 B2* | 5/2009 | Shigemura | 427/66 |
| 2001/0004469 A1* | 6/2001 | Himeshima et al. | 427/66 |
| 2001/0019807 A1* | 9/2001 | Yamada et al. | 427/272 |
| 2002/0102754 A1* | 8/2002 | Fujimori et al. | 438/22 |
| 2003/0111957 A1* | 6/2003 | Kim et al. | 313/609 |
| 2003/0201711 A1* | 10/2003 | Abiko | 313/504 |
| 2005/0264177 A1* | 12/2005 | Chung et al. | 313/503 |

FOREIGN PATENT DOCUMENTS

| | | |
|---|---|---|
| CN | 2306386 Y | 2/1999 |
| CN | 1329458 A | 1/2002 |
| JP | 10-8239 | 1/1998 |

(Continued)

OTHER PUBLICATIONS

Certified English translation of Mizuguchi (JP 10-008239).*

(Continued)

*Primary Examiner*—Mariceli Santiago
*Assistant Examiner*—Natalie K Walford
(74) *Attorney, Agent, or Firm*—Stein McEwen, LLP

(57) ABSTRACT

An evaporation mask, a method of manufacturing an organic electroluminescent device using the evaporation mask, and an organic electroluminescent device manufactured by the method are provided. The evaporation mask is formed of a thin film and is drawn taut by application of tension. The evaporation mask includes at least one mask unit, the mask unit including a plurality of main apertures, and a plurality of first dummy apertures formed adjacent to outermost ones of the main apertures in a direction in which tension is applied to the evaporation mask.

21 Claims, 21 Drawing Sheets

FOREIGN PATENT DOCUMENTS

| | | | |
|---|---|---|---|
| JP | 10008239 A * | 1/1998 | |
| JP | 2000-12238 | 1/2000 | |
| JP | 2000-48954 | 2/2000 | |
| JP | 2000-160323 | 6/2000 | |
| JP | 2000-173769 | 6/2000 | |
| JP | 2001-110567 | 4/2001 | |
| JP | 2001-118780 | 4/2001 | |
| JP | 2001-203079 | 7/2001 | |
| JP | 2001-247961 | 9/2001 | |
| JP | 2001-254169 | 9/2001 | |
| JP | 2001-273979 | 10/2001 | |
| JP | 2002-8859 | 1/2002 | |
| JP | 2002-9098 | 1/2002 | |
| JP | 2002-60927 | 2/2002 | |
| JP | 2002060927 A * | 2/2002 | |
| JP | 2002-252083 | 9/2002 | |
| JP | 4173722 | 10/2008 | |

OTHER PUBLICATIONS

English translation of JP 2000-160323.*

English translation of JP 2000-160323 (Yokoi).*

Official translation of JP 2002-060927 (Nakagawara et al).*

Yamazaki, et al., "Slit Structure As A Countermeasure For The Thermal Deformation of A Metal Mask", Dec. 2001, pp. 7170-7173.

Office Action issued on Oct. 14, 2004, in Japanese Patent Application JP2002-347977.

Machine English translation of JP 2000-160323 downloaded from the Japanese Industrial Property Digital Library.

T. Yamazaki et al., "Slit Structure as a Countermeasure for the Thermal Deformation of a Metal Mask," Japanese Journal of Applied Physics, vol. 40, Part 1, No. 12, Dec. 15, 2001, pp. 7170-7173.

European Search Report issued on Mar. 30, 2004, in European Patent Application No. 03257499.

Facsimile communication from the Examiner to the applicants' attorney transmitted on Apr. 23, 2009, containing a machine English translation of the detailed description of JP 2000-12238.

Chinese Office Action issued on Dec. 21, 2007, in Chinese Patent Application No. 2003101207627 (in Chinese with complete English translation).

* cited by examiner

EVAPORATION MASK, METHOD OF FABRICATING ORGANIC ELECTROLUMINESCENT DEVICE USING THE SAME, AND ORGANIC ELECTROLUMINESCENT DEVICE

CROSS-REFERENCE TO RELATED APPLICATIONS

This application claims the benefit of Japanese Application No. 2002-347977, filed Nov. 29, 2002, in the Japanese Intellectual Property Office, the disclosure of which is incorporated herein by reference.

BACKGROUND OF THE INVENTION

1. Field of the Invention

The present invention relates to an evaporation mask, and, more particularly, to an evaporation mask in which the pitch between adjacent apertures can be kept even when a tension is applied, a method of fabricating an organic electroluminescent (EL) device using the evaporation mask, and an organic EL device manufactured using the above method.

2. Description of the Related Art

EL devices, which are spontaneous light-emitting display devices, provide a wide viewing angle, good contrast, and a high response speed. Accordingly, much attention is being focused on EL devices because they can be used as a next-generation display device.

EL devices are classified as inorganic EL devices or organic EL devices, depending on what material is used to form a light-emitting layer. Organic EL devices have a higher brightness and faster responsivity than inorganic EL devices, and can provide color display, so they are presently being more actively developed.

Organic EL devices include first electrodes formed in a predetermined pattern on a transparent insulating substrate, an organic film formed on the first electrodes by vacuum evaporation, and second electrodes formed on the organic film such that the first and second electrodes cross each other.

In the manufacture of the organic EL devices having such a structure, the first electrodes are typically formed by patterning indium tin oxide (ITO) using a photolithographic method.

Such a photolithographic method can be used before an organic film is formed, but causes a problem when it is used after an organic film is formed. Because the organic film is very sensitive to water, it must be thoroughly isolated from water both while being fabricated and after the fabrication. Consequently, a photolithographic method including an exposure to water during peeling-off and etching of a resist is not suitable for patterning the organic film and the second electrode layer.

This problem is usually solved by vacuum-depositing an organic light emissive material for the organic film and a material for the second electrode layer using a patterned mask. In particular, the second electrode layer can be patterned using a cathode separator, but it is known that a vacuum evaporation method using an evaporation mask is the most appropriate way to pattern a low molecular organic film.

A technique of patterning an organic film or a second electrode layer using a mask is very important in the manufacture of full-color organic EL devices.

Examples of conventional full-color organic EL device coloring methods include a three-color independent evaporation method, in which red (R), green (G), and blue (B) color pixels are independently deposited on a substrate, a color conversion method (CCM), in which a color conversion layer is formed on a light emissive surface using a blue light source, and a color filtering method, which uses a white light source and a color filter. The three-color independent evaporation method has attracted much attention because it is simple to perform, and provides a high color purity and efficiency.

In the three-color independent evaporation method, the R, G, and B color pixels are independently deposited on a substrate using an evaporation mask. Here, the evaporation mask must be made of a material with a low thermal expansion coefficient in order to prevent thermal deformation, and also must be magnetic if the evaporation mask is to be adhered to the substrate using a magnet. More importantly, the evaporation mask must be highly accurate. In particular, the positions of deposited pixels, that is, the widths of pattern apertures, must be highly accurate, and a high accuracy of a total mask pitch is also required. For example, if an organic EL device must have a high fineness of 130 ppi or greater and an aperture efficiency of 50% or greater, deviation in the widths of apertures of the evaporation mask must not exceed ±5 μm, and deviation in the total mask pitch must not exceed ±10 μm.

As shown in FIG. 1, an evaporation mask 10 used to deposit an organic film or electrodes when fabricating an organic EL device is typically supported by a frame 20, so that the evaporation mask 10 is drawn taut. In the mask 10, a plurality of mask units 12, allowing a single organic EL device to be formed thereon, are formed on a single metal thin plate 11.

Because the evaporation mask 10 is thinly formed and minutely patterned, if it is used without any treatment, some parts of it may droop, preventing accurate patterning. Accordingly, as shown in FIG. 1, optimal tension in the x- and y-axis directions is applied to the evaporation mask 10 to obtain a predetermined accuracy of a total pitch (Pt), and the taut evaporation mask 10 is coupled to the mask frame 20. Upon coupling, it is important to not change the Pt accuracy. The coupling of the evaporation mask 10 to the mask frame 20 can be achieved by various methods such as using an adhesive, laser welding, or resistance welding.

Each of the mask units 12 includes a pattern of apertures. As shown in FIG. 1, each of the mask units 12 may have strip-like apertures elongated in the y-axis direction. However, the tension makes it difficult for the outermost apertures of each of the mask units 12 to maintain a predetermined level of accuracy.

FIG. 2 is a cross-section of a mask unit 12 taken along line I-I of FIG. 1, which shows apertures 13 formed in the mask unit 12. As shown in FIG. 2, a shielding portion 14 is provided between adjacent apertures 13, and outermost apertures 13a are each defined by a shield portion 14 and a rib 15 between adjacent mask units.

As shown in FIG. 2, if tension is applied to the evaporation mask 10 having the apertures 13 in the x- and y-axis directions as shown in FIG. 1, an edge portion 15a of the rib 15 may curve upward. Such deformation of the edge portion 15a of the rib 15 degrades the accuracy of the widths of each of the outermost apertures 13a. Hence, the accuracy of deposition performed on an organic emissive film through the outermost apertures 13a is degraded, and, consequently, accurate patterning of the organic emissive film is not accomplished outside a panel. If an edge of a rib between adjacent mask units is deformed, the deformed rib contacts the organic emissive film, thus generating a defect such as a dark point or a pixel short-circuit on the perimeter of a panel.

As shown in FIG. 3, this problem affects the outermost mask units more than other mask units, thus degrading the accuracy of the total mask pitch.

In other words, as shown in FIG. 3, particularly, mask units 12a and 12b located at the outermost sides in the direction perpendicular to the direction of the length of apertures 13, that is, in the x-axis direction where tension is applied, may be deformed more seriously than other mask units 12 due to the tension applied in the x-axis direction. Accordingly, the accuracy of a total pitch (Pt), the gap between a line 16a connecting the edges of the outer ribs of the mask units 12a and a line 16b connecting the edges of the outer ribs of the mask units 12b, decreases, resulting in degradation of the accuracy of patterning of the mask units 12.

A mask that overcomes the problem of the deformation of strips that form slits due to thermal expansion of the mask is disclosed in Japanese Patent Publication No. 2001-247961. The disclosed mask includes a mask portion and a screen portion. The mask portion is an evaporation mask used to form a patterning film on a substrate by evaporation, and has partitions for defining a plurality of first apertures. The screen portion contains a magnetic material and has a plurality of second apertures smaller than the first apertures. The second apertures are disposed on the first apertures of the mask portion.

Japanese Patent Publication No. 2001-273979 discloses the structure of a magnetic mask. Japanese Patent Publication No. 2001-254169 discloses an evaporation mask frame assembly in which a patterned mask masks a deposition area while adhering closely to a material to be deposited, and has fine gaps and fine patterns. The fine patterns of the patterned mask are supported by fine ribs.

These disclosed masks adhere closely to a material to be deposited because they are formed of a magnetic material. However, these masks still have a problem of losing accuracy due to the deformation of the outermost apertures during a tensing operation.

Japanese Patent Publication No. 2002-9098 discloses a pattern forming apparatus for preventing a pre-formed film on a substrate from being damaged due to a mask coming partially off of a frame due to a thermal expansion during evaporation. The pattern forming apparatus includes a support which is formed to be larger than the mask, and has a dent portion onto which the mask is seated. The support prevents a mask from becoming rippled due to thermal expansion during the formation of a film. Also, by forming a magnetic element on the side of the mask facing away from the support, the magnetic element makes the mask closer to the substrate so that a space between the mask and the support is created. This space contributes to cooling the mask.

However, because the disclosed mask having slits is not firmly supported by the frame, the location of the mask cannot be accurately controlled. In particular, in the case of organic EL devices that must have very thin evaporation masks to accomplish highly accurate patterning, the location of the evaporation mask may be changed during evaporation.

Japanese Patent Publication No. 2002-8859 discloses a pattern forming apparatus for preventing a mask from being expanded by heat during the formation of a film, in which a liquid path is formed within a frame which supports the mask, and a cooling solution circulates within the liquid path. However, this invention also overlooks the possibility of tensions and apertures becoming inaccurate during fixation of the mask into the frame.

Japanese Patent Publication Nos. 2000-48954, 2000-173769, 2001-203079, and 2001-110567 disclose metal masks including supplementary lines to prevent drooping of a mask shield between the mask and a frame. Like the above-disclosed masks, these masks may be stretched and warped while being fixed onto a frame after applying tension in order to accomplish highly accurate patterning.

SUMMARY OF THE INVENTION

The present invention provides an evaporation mask that reduces deviation of patterns by reducing variation in the accuracy of the widths of apertures that may be caused by supporting a taut evaporation mask, a method of manufacturing an organic EL device using the evaporation mask, and an organic EL device manufactured by the method.

The present invention also provides an evaporation mask that improves pattern accuracy by compensating for a total pitch when tension is applied to the evaporation mask, a method of manufacturing an organic EL device using the evaporation mask, and an organic EL device manufactured by the method.

Additional aspects and/or advantages of the invention will be set forth in part in the description which follows and, in part, will be obvious from the description, or may be learned by practice of the invention.

According to an aspect of the present invention, there is provided an evaporation mask formed of a thin film, wherein the evaporation mask is drawn taut by application of tension and comprises at least one mask unit. The mask unit includes a plurality of main apertures and a plurality of first dummy apertures formed adjacent to outermost ones of the main apertures in a direction in which tension is applied to the evaporation mask.

The main apertures may form an effective deposition area, and the first dummy apertures may form an ineffective deposition area.

At least one of the first dummy apertures may be formed parallel to the main apertures, and at least another one of the first dummy apertures may be formed perpendicular to the main apertures.

The evaporation mask may comprise at least two mask units, and may further comprise a plurality of second dummy apertures formed outside and adjacent to the outermost mask units in the direction in which tension is applied to the evaporation mask.

The second dummy apertures may be formed outside the effective deposition areas where the mask units are formed.

Alternatively, at least one of the second dummy apertures may be formed parallel to the main apertures of the mask units, and at least another one of the second dummy apertures may be formed perpendicular to the main apertures.

According to an aspect of the present invention, there is provided another evaporation mask formed of a thin film, wherein the evaporation mask is drawn taut by application of tension. The evaporation mask includes at least two mask units each having at least one main aperture and at least one second dummy aperture formed outside and adjacent to the mask units located at the outermost sides in the direction in which tension is applied to the evaporation mask.

The at least one main aperture of each of the mask units may be used to form an effective deposition area, and the at least one second dummy aperture may be formed outside of the effective deposition areas where the mask units are formed.

Alternatively, the at least one second dummy aperture may comprise at least two second dummy apertures, wherein at least one of the second dummy apertures may be formed parallel to the at least one main aperture of the mask units, and at least another one of the second dummy apertures may be formed perpendicular to the at least one main aperture.

According to another aspect of the present invention, there is provided a method of manufacturing an organic electroluminescent (EL) device. In this method, first electrodes are formed on a substrate. Next, an evaporation mask to form an organic film is disposed over the substrate. Here, the evaporation mask is drawn taut by application of tension and has at least one mask unit. The mask unit comprises a plurality of main apertures and a plurality of first dummy apertures formed adjacent to outmost main apertures in a direction in which tension is applied to the evaporation mask. The organic film comprises an effective luminescent area formed to cover at least the first electrodes by evaporating an organic material containing an organic luminescent material through the main apertures. At this time, a first dummy pattern area is formed outside the effective luminescent area through the first dummy apertures. Thereafter, second electrodes are formed on the organic film so that the effective luminescent area is formed at an area where the first and second electrodes overlap. Finally, the resulting structure is sealed.

At least one of the first dummy apertures may be formed parallel to the main apertures, and at least another one of the first dummy apertures may be formed perpendicular to the main apertures.

At least two organic EL devices may be manufactured in a single process, and the evaporation mask may comprise at least two mask units, through each of which the organic film of a single organic EL device can be deposited, and a plurality of second dummy apertures outside and adjacent to outermost ones of the mask units in the direction in which tension is applied to the evaporation mask.

The second dummy apertures of the evaporation mask may be located outside the effective luminescent areas of the organic EL devices that may be deposited by the outermost mask units adjacent to the second dummy apertures.

At least one of the second dummy apertures may be formed parallel to the main apertures of the mask units, and at least one of the second dummy apertures may be formed perpendicular to the main apertures.

To form the second electrodes, first, an evaporation mask to form the second electrodes may be disposed over the substrate. Here, the evaporation mask is drawn taut by application of tension and has at least one mask unit. The mask unit comprises a plurality of main apertures and a plurality of first dummy apertures formed adjacent to the outermost main apertures in the direction in which tension is applied to the evaporation mask. Then, the second electrodes may be formed on the effective luminescent area through the main apertures, and a second dummy pattern area may be formed outside the effective luminescent area through the first dummy apertures.

At least one of the first dummy apertures may be formed parallel to the main apertures, and at least another one of the first dummy apertures may be formed perpendicular to the main apertures.

At least two organic EL devices may be manufactured in a single process. The evaporation mask may comprise at least two mask units, through each of which the second electrodes of a single organic EL device can be deposited, and a plurality of second dummy apertures outside and adjacent to the outermost mask units in the direction in which tension is applied to the evaporation mask.

The second dummy apertures may be located outside the effective luminescent areas of the organic EL devices that are deposited by the outermost mask units adjacent to the second dummy apertures.

At least one of the second dummy apertures may be formed parallel to the main apertures of the mask units, and at least another one of the second dummy apertures may be formed perpendicular to the main apertures.

At least two organic EL devices may be manufactured in a single process. The second electrodes may be formed using an evaporation mask drawn taut by application of tension and having at least two mask units, through which the second electrodes of the organic EL device can be deposited. The evaporation mask may comprise a plurality of second dummy aperture outside and adjacent to outermost mask units in the direction in which tension is applied to the evaporation mask.

The second dummy apertures may be located outside the effective luminescent areas of the organic EL devices that are deposited by the outermost mask units adjacent to the second dummy apertures.

At least one of the second dummy apertures may be formed parallel to the main apertures of the mask units, and at least another one of the second dummy apertures may be formed perpendicular to the main apertures.

According to another aspect of the present invention, there is provided another method of manufacturing an organic EL device. In this method, first electrodes for an organic EL device are formed on a substrate. Next, an evaporation mask to form an organic film is disposed over the substrate. Here, the evaporation mask is drawn taut by application of tension and includes at least two mask units. Each of the mask units comprises a plurality of main apertures and a plurality of second dummy apertures formed outside and adjacent to outermost ones of the mask units in a direction in which tension is applied to the evaporation mask. The organic film comprising an effective luminescent area is formed to cover at least the first electrodes by evaporating an organic material containing an organic luminescent material through the main apertures of each of the mask units. Thereafter, second electrodes are formed on the organic film so that the effective luminescent area is formed at an area where the first and second electrodes overlap. Finally, the resulting structure is sealed.

The second dummy apertures may be located outside the effective luminescent areas of the organic EL devices that are deposited by outermost ones of the mask units adjacent to the second dummy apertures.

Alternatively, the second dummy apertures may be formed parallel to the main apertures of the mask units, and at least another one of the second dummy apertures may be formed perpendicular to the main apertures.

In an alternative process of forming the second electrodes, an evaporation mask to form the second electrodes may be disposed over the substrate. Here, the evaporation mask may be drawn taut by application of tension and includes at least two mask units. Each of the mask units may comprise a plurality of main apertures and a plurality of first dummy apertures formed adjacent to the outermost main apertures in the direction in which tension is applied to the evaporation mask. Then, the second electrodes may be formed on each of the effective luminescent areas through the main apertures, and a second dummy pattern area may be formed outside each of the effective luminescent areas through the first dummy apertures.

At least one of the first dummy apertures may be formed parallel to the main apertures, and at least another one of the first dummy apertures may be formed perpendicular to the main apertures.

The evaporation mask may comprise a plurality of second dummy apertures outside and adjacent to the outermost mask units in the direction in which tension is applied to the evaporation mask.

The second dummy apertures of the evaporation mask may be located outside the effective luminescent areas of the organic EL devices that are deposited by the outermost mask units adjacent to the second dummy apertures.

At least one of the second dummy apertures may be formed parallel to the main apertures of the mask units, and at least another one of the second dummy apertures may be formed perpendicular to the main apertures.

In another alternative process of forming the second electrodes, the second electrodes may be formed using an evaporation mask. The evaporation mask may be drawn taut by application of tension and may have at least two mask units, through each of which the second electrodes of the organic EL devices may be deposited. The evaporation mask may comprise a plurality of second dummy apertures outside and adjacent to outermost mask units in the direction in which tension is applied to the evaporation mask.

At least one of the second dummy apertures of the evaporation mask may be located outside the effective luminescent areas of the organic EL device that may be deposited by the outermost mask units adjacent to the second dummy apertures.

The second dummy apertures may be formed parallel to the main apertures of the mask units, and at least one of the second dummy apertures may be formed perpendicular to the main apertures.

According to another aspect of the present invention, there is provided still another method of manufacturing an organic EL device. In this method, first electrodes are formed on a substrate in a predetermined pattern. Next, an organic film comprising an effective luminescent area is formed to cover at least the first electrodes by evaporating an organic material containing an organic luminescent material. Thereafter, an evaporation mask to form second electrodes is disposed over the organic film. Here, the evaporation mask is drawn taut by application of tension and comprises a plurality of main apertures and a plurality of dummy apertures formed adjacent to the outermost ones of the main apertures in a direction in which tension is applied to the evaporation mask. Second electrodes are formed through the main apertures so that the effective luminescent area is formed at an area where the first and second electrodes overlap. At this time, a second dummy pattern area is formed outside the effective luminescent area through the first dummy apertures. Finally, the resulting structure is sealed.

At least one of the first dummy apertures may be formed parallel to the main apertures, and at least another one of the first dummy apertures may be formed perpendicular to the main apertures.

At least two organic EL devices may be manufactured in a single process. The evaporation mask may comprise at least two mask units, through each of which the second electrodes of a single organic EL device can be deposited, and a plurality of second dummy apertures outside and adjacent to outermost ones of the mask units in the direction in which tension is applied to the evaporation mask.

The second dummy apertures of the evaporation mask may be located outside the effective luminescent areas of the organic EL devices that may be deposited by the outermost mask units adjacent to the second dummy apertures.

At least one of the second dummy apertures may be formed parallel to the main apertures of the mask units, and at least another one of the second dummy apertures may be formed perpendicular to the main apertures.

According to another aspect of the present invention, there is provided still yet another method of manufacturing an organic EL device. In this method, first electrodes for an organic EL device are formed on a substrate. Next, an organic film comprising an effective luminescent area is formed to cover at least the first electrodes by evaporating an organic material containing an organic luminescent material. An evaporation mask to form second electrodes is disposed over the organic film. Here, the evaporation mask is drawn taut by application of tension and comprises at least two mask units. Each of the mask units comprises a plurality of main apertures and a plurality of second dummy apertures formed outside and adjacent to the outermost ones of the mask units in a direction in which tension is applied to the evaporation mask. Second electrodes are formed through the main apertures of each of the mask units so that the effective luminescent area is formed at an area where the first and second electrodes overlap. Finally, the resulting structure is sealed.

The second dummy apertures of the evaporation mask may be located outside the effective luminescent areas of the organic EL devices that may be deposited by the outermost mask units adjacent to the second dummy apertures.

At least one of the second dummy apertures may be formed parallel to the main apertures of the mask units, and at least one of the second dummy apertures may be formed perpendicular to the main apertures.

According to still another aspect of the present invention, there is provided an organic EL device including a substrate, an effective luminescent area, a terminal unit, a sealing unit, and a dummy pattern area. The effective luminescent area is formed by sequentially stacking first electrodes, an organic film including an organic luminescent layer, and second electrodes on the substrate. The organic film emits light at the area where the first and second electrodes overlap. The terminal unit is formed on the edge of the substrate outside the effective luminescent area and has a first electrode terminal connected to the first electrodes and a second electrode terminal connected to the second electrodes. The sealing unit is formed on the substrate so as to expose the terminal unit and seal at least the effective luminescent area. The dummy pattern area is formed outside of the effective luminescent area.

The dummy pattern area may be formed between the effective luminescent area and the terminal unit.

The dummy pattern area may be formed inside an area sealed by the sealing unit.

The dummy pattern area may be formed of the same material as the organic luminescent layer.

The dummy pattern area may be formed of the same material as the organic film.

The dummy pattern area may be formed of the same material as the second electrodes.

The dummy pattern area may be formed on the outside of the organic luminescent area in an upper area of the organic film.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
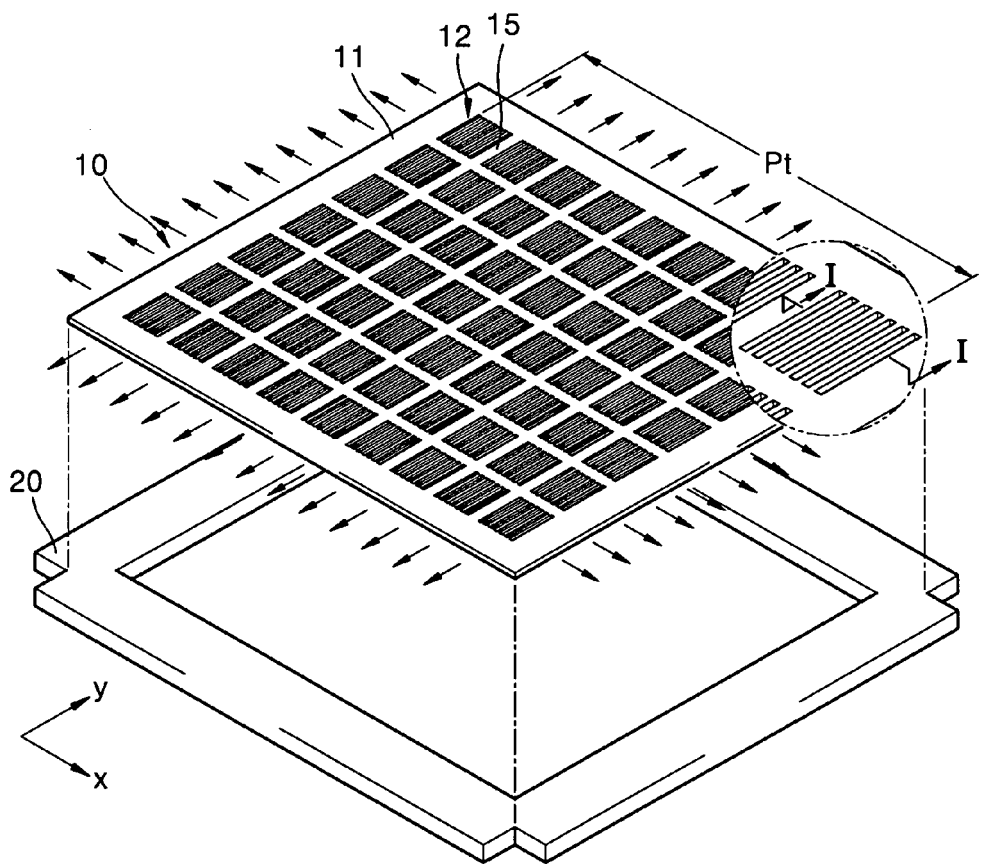
FIG. 1 is an exploded perspective view of a conventional evaporation mask.
Figure 2:
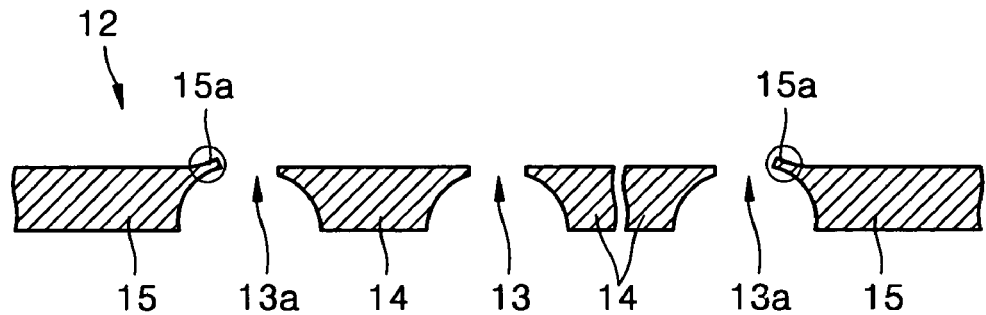
FIG. 2 is a cross-section of part of the evaporation mask of FIG. 1.
Figure 3:
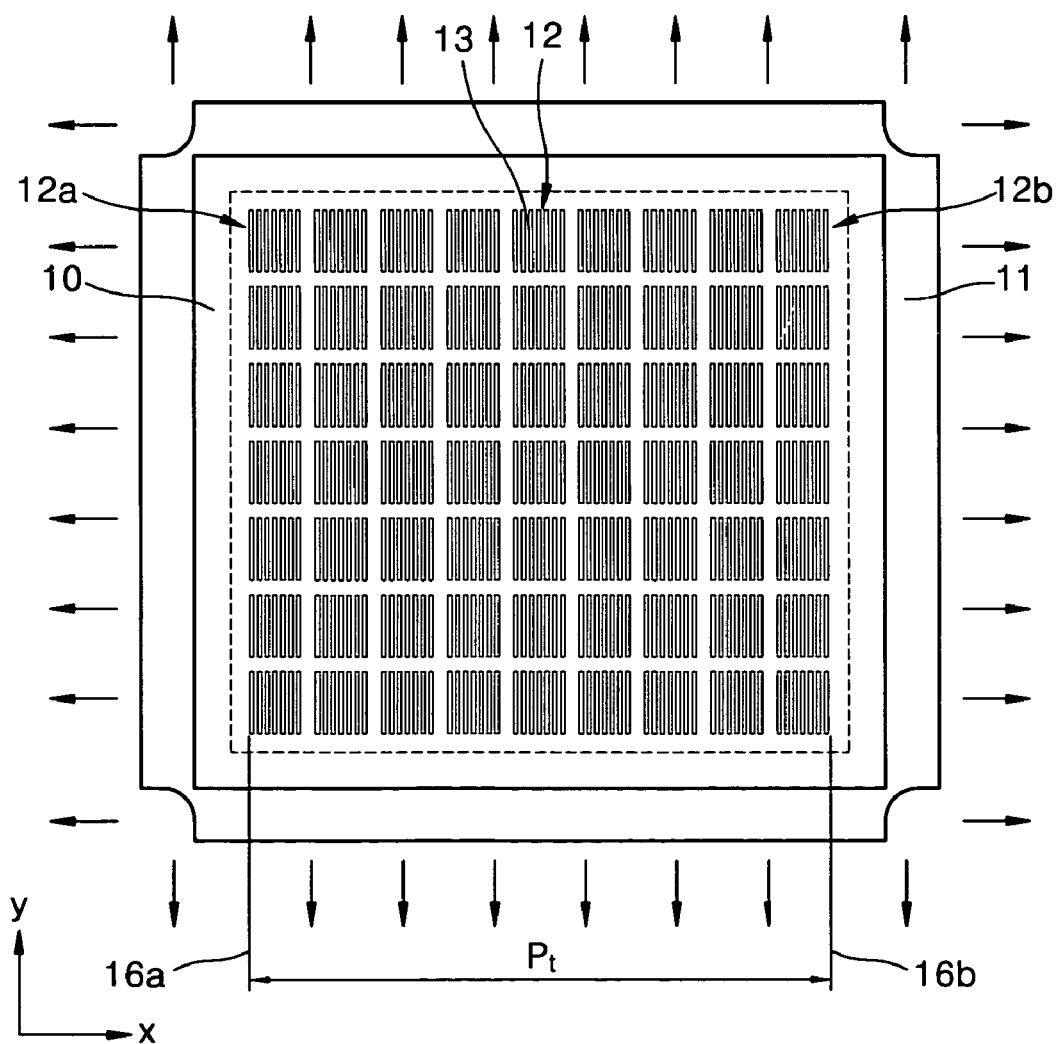
FIG. 3 is a plan view of the evaporation mask of FIG. 1.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 4:
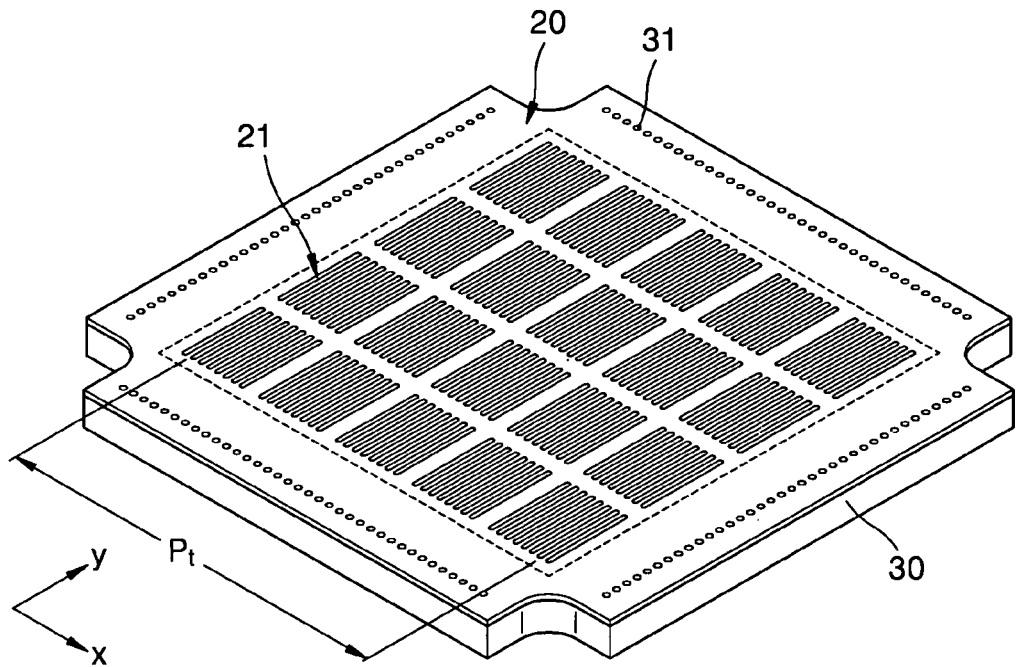
FIG. 4 is a perspective view of an evaporation mask according to an embodiment of the present invention.
Figure 5:
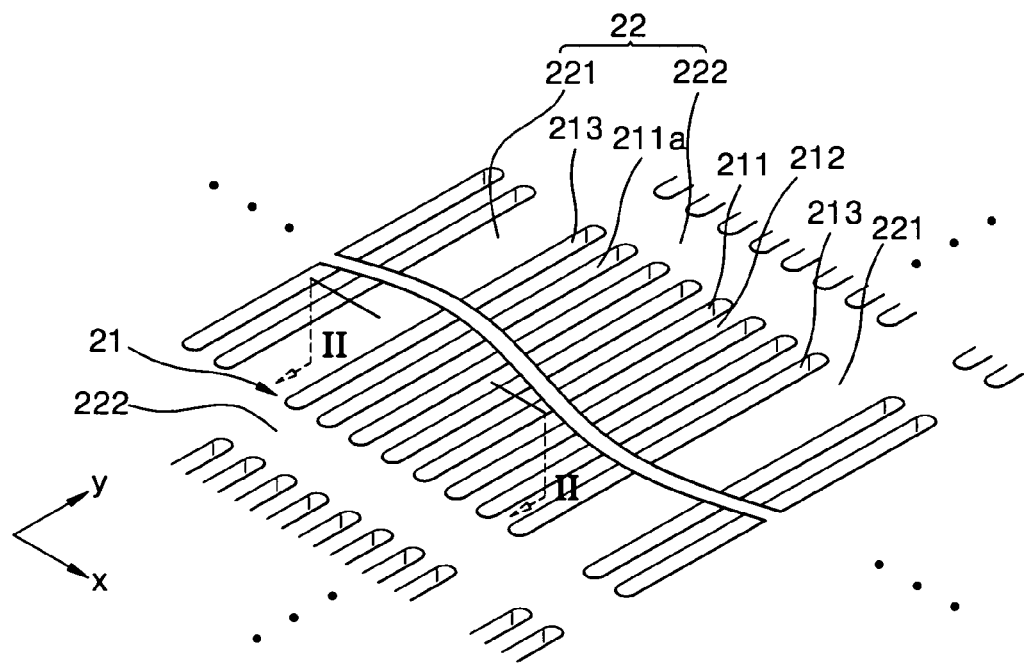
FIG. 5 is a partial perspective view of a mask unit of the evaporation mask of FIG. 4.
Figure 6:
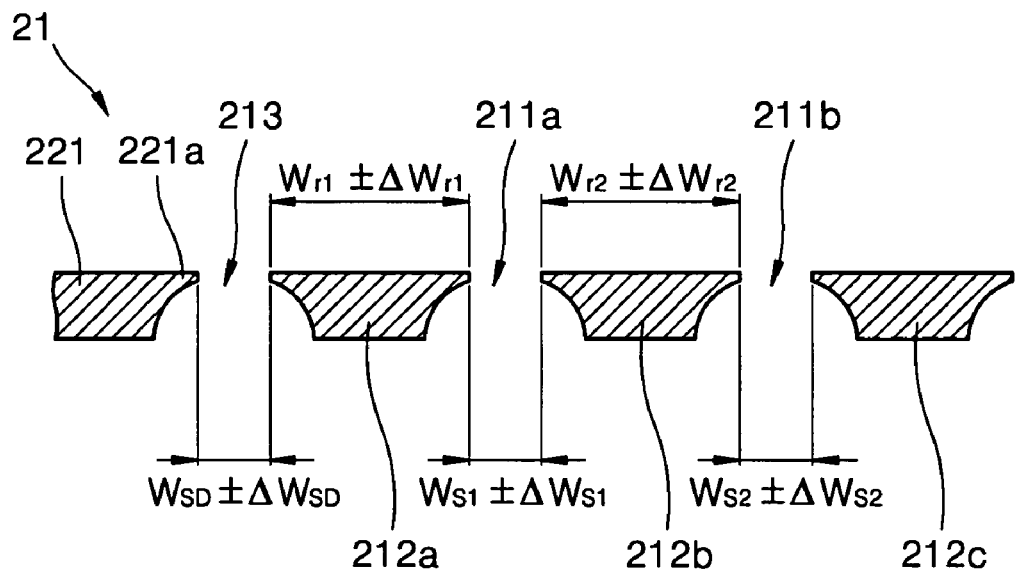
FIGS. 6 and 7 are cross-sections taken along line II-II of FIG. 5.

Referring to FIGS. 4 through 6, an evaporation mask 20 according to an embodiment of the present invention includes a plurality of mask units 21. As shown in FIG. 4, the plurality of mask units 21 can be patterned on many products in a single process. The evaporation mask 20 may be a magnetic thin plate made of nickel or an alloy of nickel and cobalt. Preferably, the evaporation mask 20 is made of a nickel-cobalt alloy, which facilitates the formation of fine patterns and provides an excellent surface roughness. Apertures 211 and 213 in the evaporation mask 20 may be formed in a predetermined pattern by an electro-forming method so as to obtain a fine pattern and an excellent surface smoothness. The alloy of Ni and Co may be composed of 85% by weight nickel and 15% by weight cobalt.

The evaporation mask 20 may be manufactured by an etching method, that is, by forming a photoresist layer having a pattern of apertures 211 and 213 on a thin plate, or attaching a film having the pattern of apertures 211 and 213 to a thin plate and then etching the resulting plate.

As shown in FIG. 4, tension is applied to the evaporation mask 20 manufactured by the etching method in x- and y-axis directions while its edges are fixed by a clamp or an adhesive agent. Then, the taut evaporation mask 20 is joined to a mask frame 30. The mask frame 30 is hollow so as to support the edge of the evaporation mask 20 excluding the portion where the mask units 21 have been formed. The joining can be achieved by various methods, such as using an adhesive agent, a laser welding method, or a resistance heating welding method. Especially, the laser welding method can be used to overcome a problem such as an accuracy change or the like. In FIG. 4, reference numeral 31 denotes a welding dot used in laser welding.

Although not shown in the drawings, a portion of the evaporation mask 20 to be welded to the mask frame 30 may be covered by a cover frame to prevent the evaporation mask 20 from coming off the mask frame 30, in order to overcome stretching or warping of the evaporation mask due to poor welding of the evaporation mask 20 to the mask frame 30.

As shown in FIG. 5, each of the mask units 21 included in the evaporation mask 20 includes a pattern of a plurality of apertures 211 and 213, which are defined by strip-like shielding portions 212. The apertures 211 and 213 shown in FIGS. 4 and 5 are elongated in parallel straight lines. However, the apertures 211 and 213 are not limited to such strip shapes, and can be formed in various shapes and patterns, such as lattice or mosaic shapes. A rib 22 is installed between adjacent mask units 21 so as to keep a distance therebetween. The rib 22 can be a first rib 221 for isolating mask units 21 arranged in the x-axis direction, or a second rib 222 for isolating mask units 21 arranged in the y-axis direction.

The apertures 213 are first dummy apertures located at the outermost place in a direction in which tension is applied to the evaporation mask 20, while the apertures 211 are main apertures located inside the first dummy apertures 213. The first dummy apertures 213 are used to prevent apertures around the edge of each of the mask units from being deformed by tension applied to the evaporation mask 20. As shown in FIG. 5, because the main apertures 211 are formed in strips elongated in the y-axis direction, apertures around the edge of each of the mask units 21 may be deformed by the tension applied in the x-axis direction rather than by the tension applied in the y-axis direction. Accordingly, the first dummy apertures 213 are installed adjacent to some of the main apertures 211 located at the outer side in the x-axis direction. Here, the main apertures 211 are used to form an effective deposition area that allows a deposition to form a pattern desired by a user, while the first dummy apertures 213 are used to form an ineffective deposition area.

FIG. 6 is a cross-section taken along line II-II of FIG. 5. First through third shielding portions 212a through 212c are sequentially formed in the x-axis direction starting from a first rib 221 to form a mask unit 21. First and second main apertures 211a and 211b are sequentially formed in the x-axis direction between the first and second shielding portions 212a and 212b and between the second and third shielding portions 212b and 212c, respectively. A first dummy aperture 213 is formed between the first rib 221 and the first shielding portion 212a.

In FIG. 6, the width Ws1 of the first main aperture 211a has a deviation of ΔWs1, and the width Ws2 of the second main aperture 211b has a deviation of ΔWs2. ΔWr1 denotes a deviation of the width Wr1 of the first shielding portion 212a, and ΔWsd denotes a deviation of the width Wsd of the first dummy aperture 213.

Figure 7:
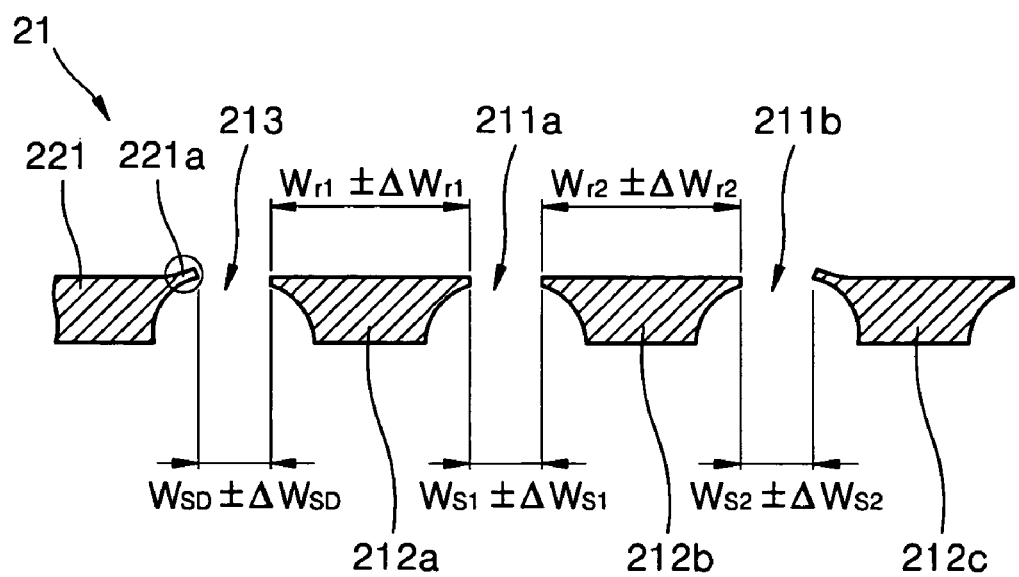
Figure 8:
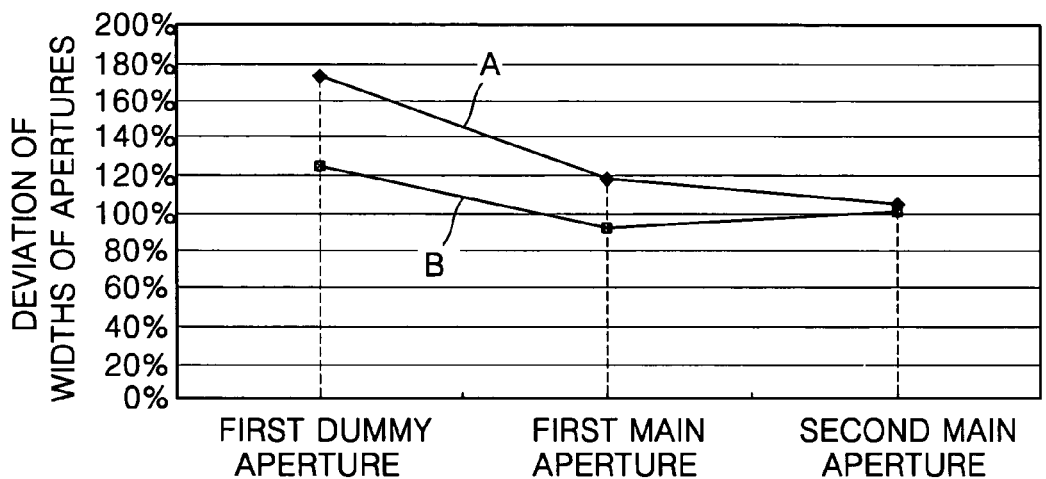
FIG. 8 is a graph showing deviation in the widths of apertures in a mask according to the present invention.

As shown in FIG. 7, when tension is applied to the evaporation mask having the apertures with the above widths, an edge 221a of the first rib 221 that defines the first dummy aperture 213 located at the edge area of the mask unit 21 is lifted upward or downward due to the extension of the evaporation mask in the x-axis direction shown in FIGS. 4 and 5. Hence, the deviation ΔWsd of the width Wsd of the first dummy aperture 213 increases. The deviation of the apertures of the evaporation mask after application of tension is shown in FIG. 8. In FIG. 8, reference character A refers to an evaporation mask manufactured by electroforming, and reference character B refers to an evaporation mask manufactured by etching. Since the deviation of the width of each of the main apertures typically depends on the deviations of the widths of the shielding portions, ΔWr1, ΔWr2, ΔWr3, . . . , the deviations of the widths of the first dummy aperture 213 and the first and second main apertures 211a and 211b, ΔWsd, ΔWs1, and ΔWs2, shown in FIG. 8, are divided by the deviation ΔWr1 of the width of the first shielding portion and then expressed as percentage.

As shown in FIG. 8, after tension is applied to the evaporation mask, the deviation ΔWsd of the width of the first dummy aperture 213 increases by 25 to 75% of the deviation ΔWr1 of the width of the first shielding portion due to deformation of the edge 221a of the first rib 221. The deviations of the widths of the first and second main apertures 211a and 211b, ΔWs1 and ΔWs2, are nearly the same as the deviation ΔWr1 of the width of the first shielding portion.

According to the experiment of FIG. 8, because the first dummy aperture 213 is deformed when tension is applied in the x-axis direction, deformation of the main apertures 211 forming an effective deposition area is minimized, and accordingly, highly accurate patterning can be achieved.

Figure 9:
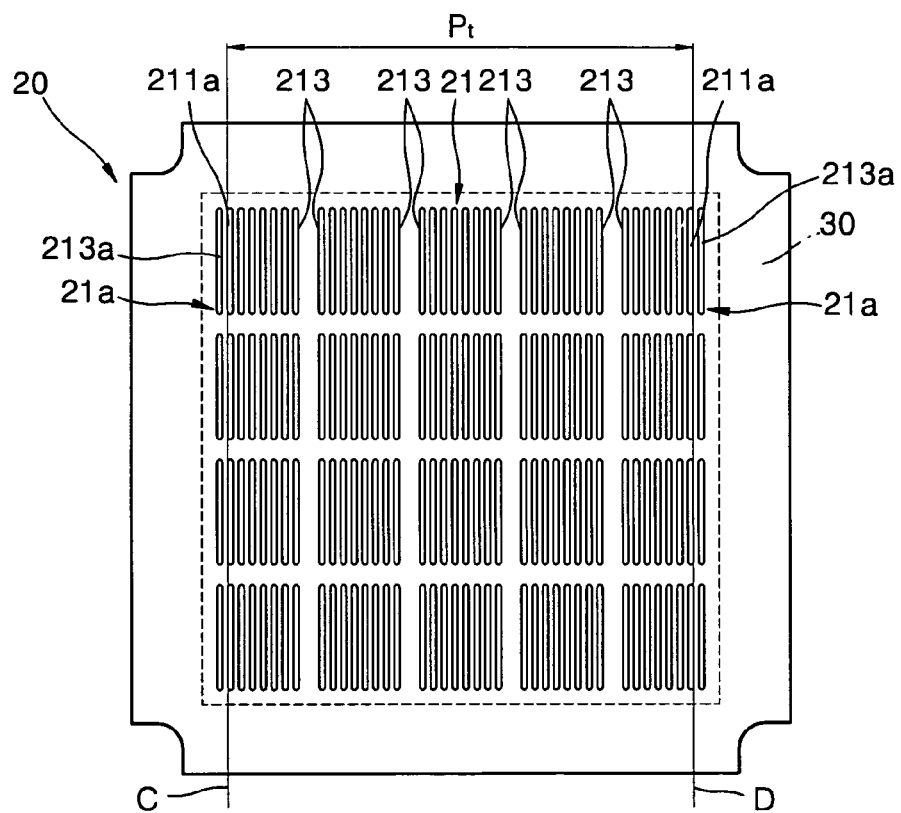
FIG. 9 is a plan view of the evaporation mask of FIG. 4.
Figure 10A:
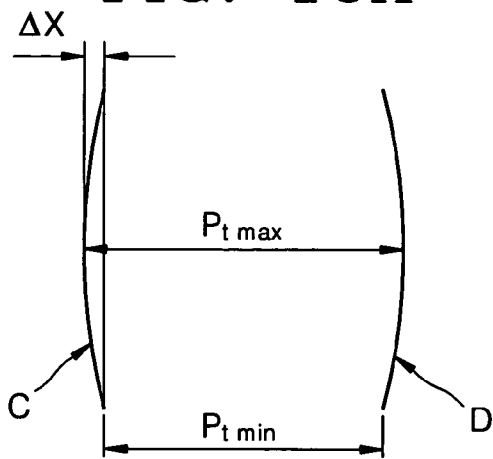
FIGS. 10A through 10C are schematic views showing deviation of the total pitch of the evaporation mask of FIG. 4 and a line deviation of the evaporation mask.
Figure 10B:
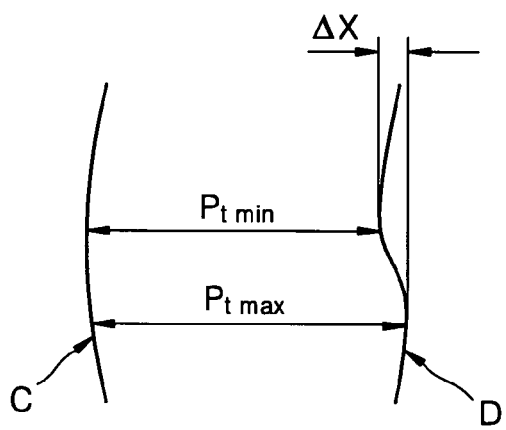
Figure 10C:
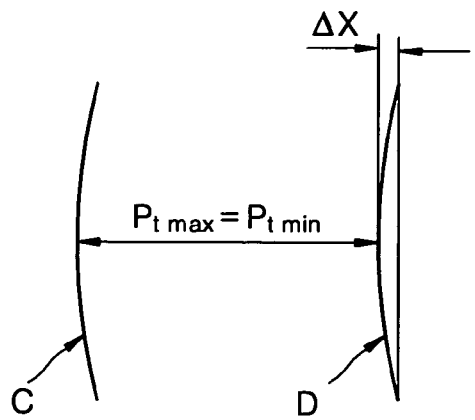

As shown in FIG. 9, because first dummy apertures 213a exist at the outermost edges of each of the mask units 21, the total pitch Pt is determined as the interval between lines C and D which connect the outermost first main apertures 211a of two mask units 21a in the x-axis direction. As shown in FIGS. 10A and 10B, the total pitch Pt may have a deviation (Pt max−Pt min). As shown in FIGS. 10A through 10C, a line deviation (ΔX) may be generated. Hence, the evaporation mask 20 and the mask frame 30 must be welded together while controlling tension for local areas so as to reduce both deviation of the total pitch and line deviation.

Figure 11:
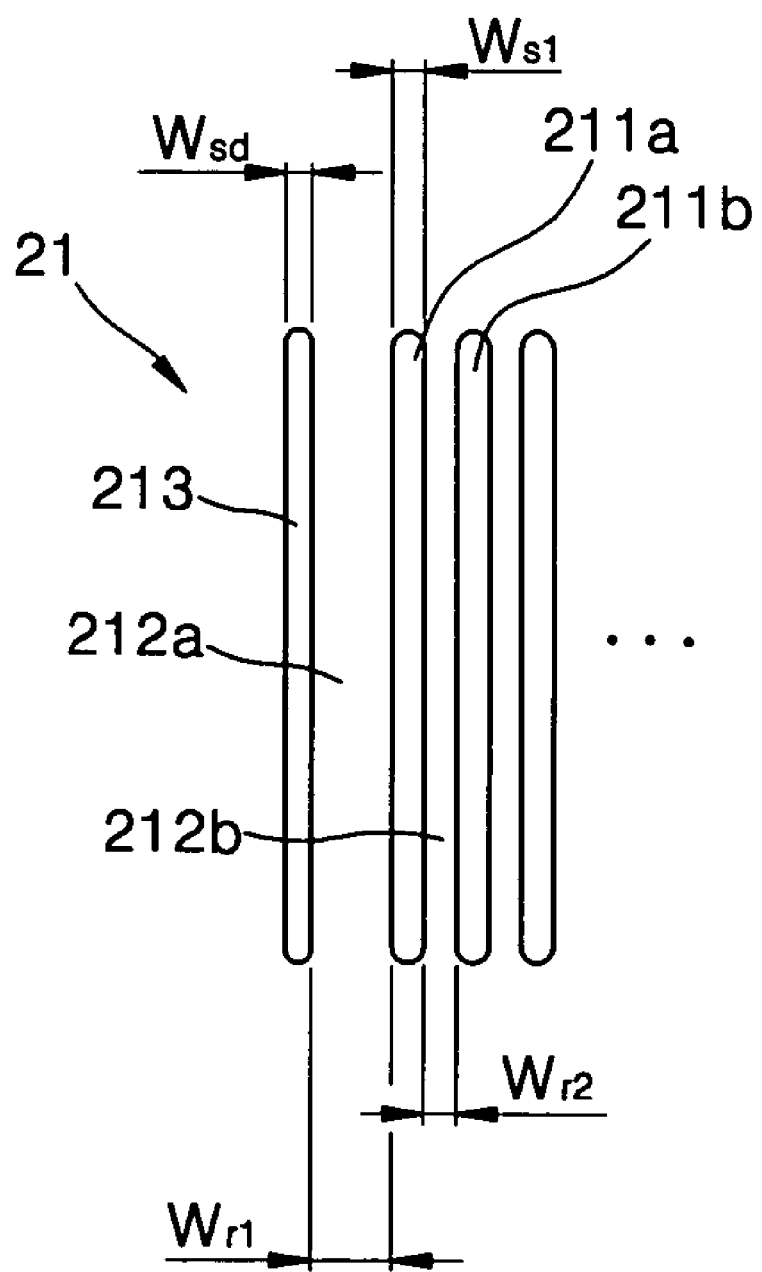
FIG. 11 is a plan view of part of a mask unit of an evaporation mask according to another embodiment of the present invention.

As shown in FIG. 5, the first dummy apertures 213 may have the same shape and width as the main apertures 211, and may be spaced apart from an adjacent first main aperture 211a by the same interval as the interval between adjacent main apertures 211. However, the first dummy apertures 213 are not limited to the above shape and pattern; any shape and pattern may be adopted as long as the pattern of the main apertures 211 is not affected. For example, as shown in FIG. 11, the width Wsd of a first dummy aperture 213 may be smaller than the width Ws1 of a first main aperture 211a, and the width Wr1 of the first shielding portion 212a between the first dummy aperture 213 and the first main aperture 211a may be greater than the width Wr2 of the second shielding portion 212b between the first and second main apertures 211a and 211b. Although not shown in the drawings, various shapes and patterns may be applied.

Figure 12:
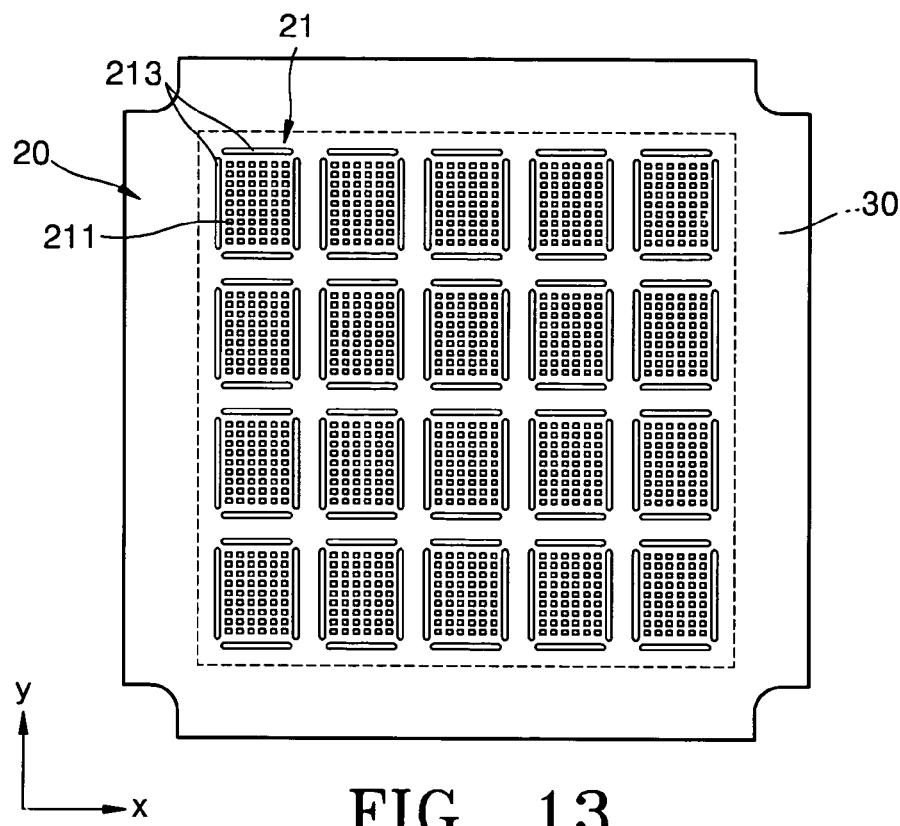
FIGS. 12 and 13 are plan views of evaporation masks according to different embodiments of the present invention.

The above-described way of shaping and installing first dummy apertures 213 is equally applied to the case of FIG. 12, where the main apertures 211 of each of the mask units 21 are arranged in a lattice pattern. However, the lattice shape of the main apertures 211 causes both tension in the x- and y-axis directions to affect the accuracy of patterning. Hence, the first dummy apertures 213 are formed near the main apertures located at the outermost edges of each of the mask units 21. As shown in FIG. 12, the first dummy apertures 213 may have a length corresponding to the length of one side of a mask unit 21 and be formed at each side of each mask unit. Alternatively, although not shown in the drawings, a plurality of first dummy apertures having a length corresponding to the length of one side of each of the lattice-like main apertures 211 may be arranged at each side of each mask unit.

Figure 13:
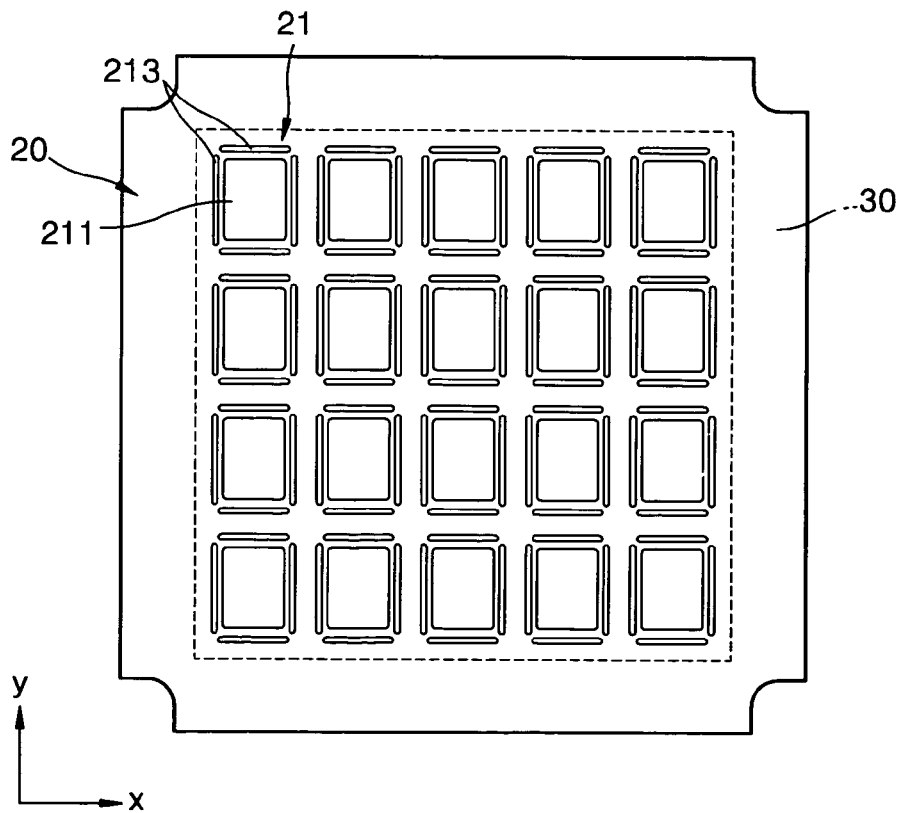

The installation of the first dummy apertures 213 of FIG. 12 can also be applied to an evaporation mask 20 of FIG. 13, which includes open mask units 21 that each have a single main aperture 211.

Figure 14:
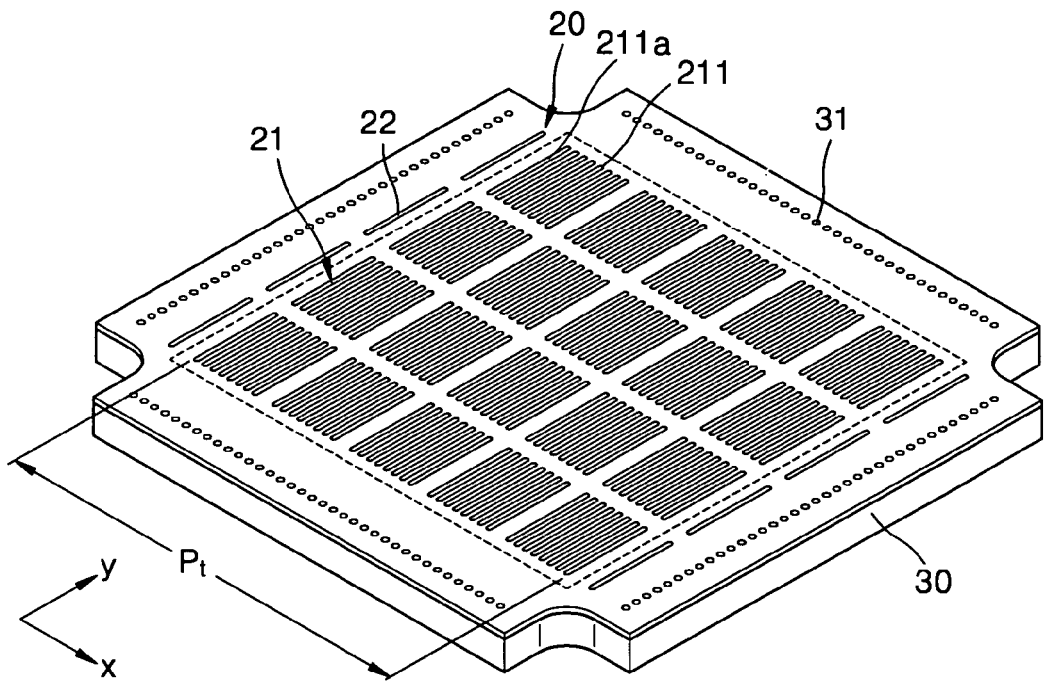
FIG. 14 is a perspective view of an evaporation mask according to yet another embodiment of the present invention.
Figure 15:
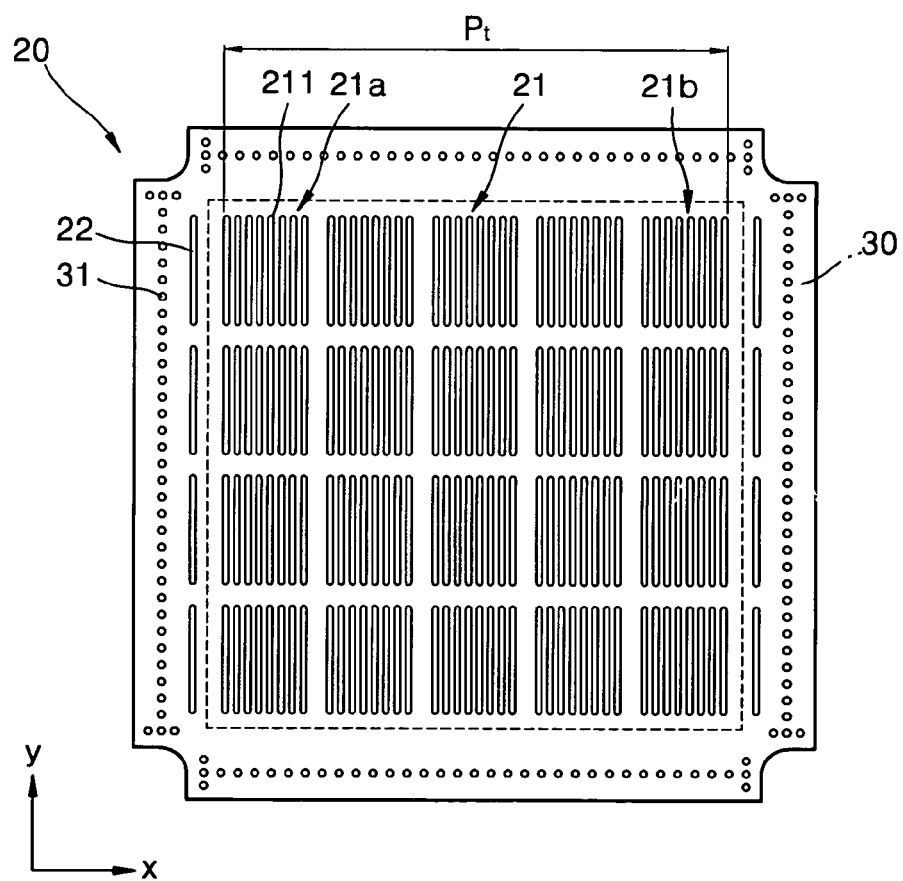
FIG. 15 is a plan view of the evaporation mask of FIG. 14.

As shown in FIG. 14, an evaporation mask 20 according to yet another embodiment of the present invention includes second dummy apertures 22 to improve accuracy. FIG. 15 is a plan view of the evaporation mask 20 of FIG. 14.

As shown in FIGS. 14 and 15, the evaporation mask 20 includes at least two mask units 21 having a predetermined pattern of main apertures 211. At least one second dummy aperture 22 is formed outside the mask units 21 such as to be adjacent to mask units 21a and 21b located at the outermost edges in the direction where tension is applied.

As shown in FIG. 14, if the main apertures 211 of the evaporation mask 20 are strips elongated in the y-axis direction, they are seriously deformed in the x-axis direction, and accordingly, the total pitch Pt is distorted in the x-axis direction. The distortion of the total pitch Pt is prevented by forming the second dummy apertures 22 so as to be adjacent to columns of masks 21a and masks 21b that are located on the edges of the evaporation mask 20, particularly, at the outermost sides in the x-axis direction. Here, because the second dummy apertures 22 are deformed due to tension applied in the x-axis direction, the main apertures 211 formed inside the second dummy apertures 22 are prevented from being deformed due to the tension. Consequently, the total pitch Pt is compensated.

As shown in FIGS. 14 and 15, the second dummy apertures 22 can be formed in the same shape and with the same width as the main apertures 211. However, the second dummy apertures 22 can have various shapes and patterns as long as they don't affect the pattern of the main apertures 211. Also, the second dummy apertures 22 may be formed on the exterior sides of the outermost mask units 21a and 21b so as to be as close as possible to the outermost mask units 21a and 21b without interfering with deposition areas desired by a user, that is, with effective deposition areas where deposition is achieved through the outermost mask units 21a and 21b. Of course, the second dummy apertures 22 must be located inside the welding dots 31 of the evaporation mask 20.

Figure 16:
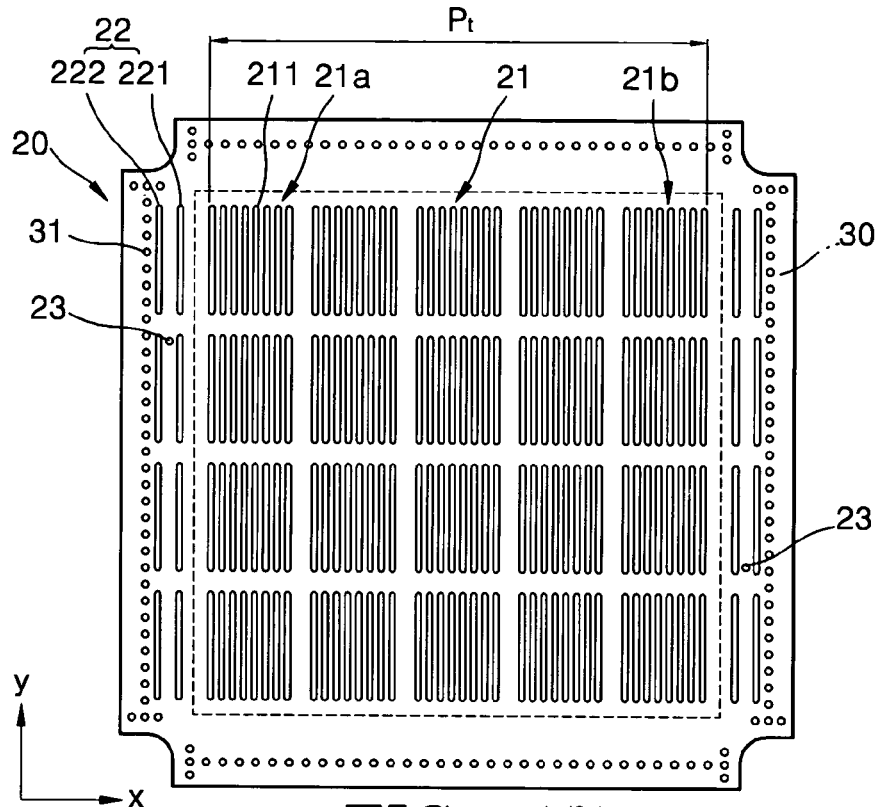
FIGS. 16 through 19 are plan views of evaporation masks according to different embodiments of the present invention.

On the other hand, as shown in FIG. 16, if alignment marks 23 are formed outside a configuration of mask units 21 in order to assist in alignment with a substrate where deposition is to be performed, the alignment marks 23 must not be deformed when tension is applied to the evaporation mask 20. If the alignment marks 23 are deformed, the evaporation mask 20 is not properly aligned with the substrate, thus causing distortion of the total pitch and inaccurate patterning.

To avoid deformation of the alignment marks 23, a pair of second dummy apertures 221 and 222 is formed at both sides of each of the alignment marks 23. The inner second dummy aperture 221 prevents the total pitch Pt from being distorted, thereby increasing the accuracy of patterning. The outer second dummy aperture 222 prevents the alignment marks 23 from being deformed, thereby accurately aligning the substrate with the evaporation mask 20.

Figure 17:
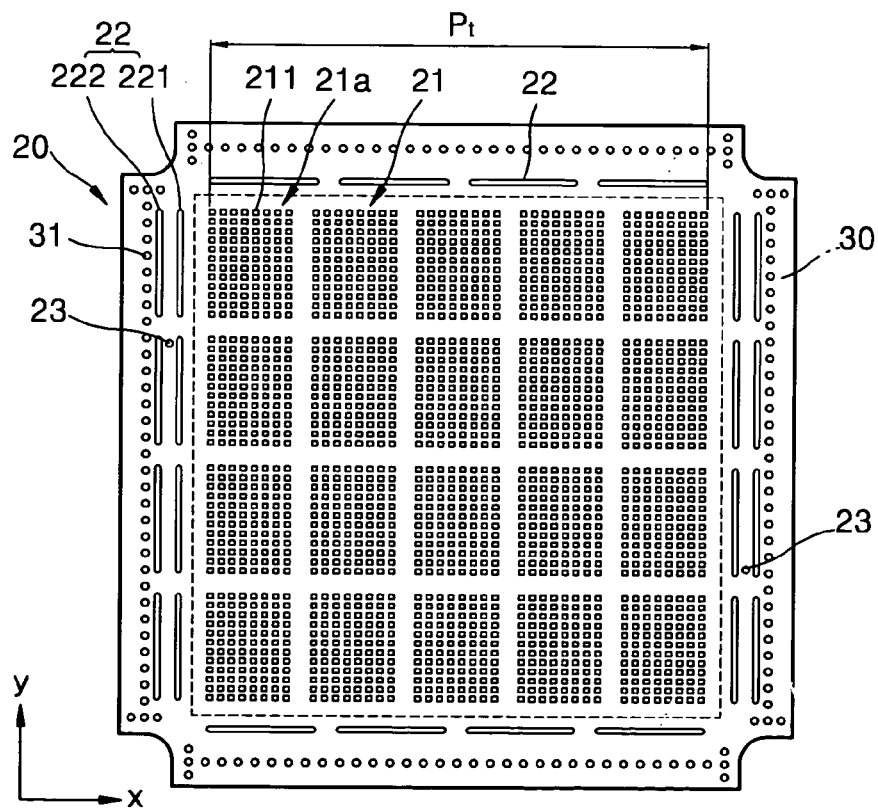
Figure 18:
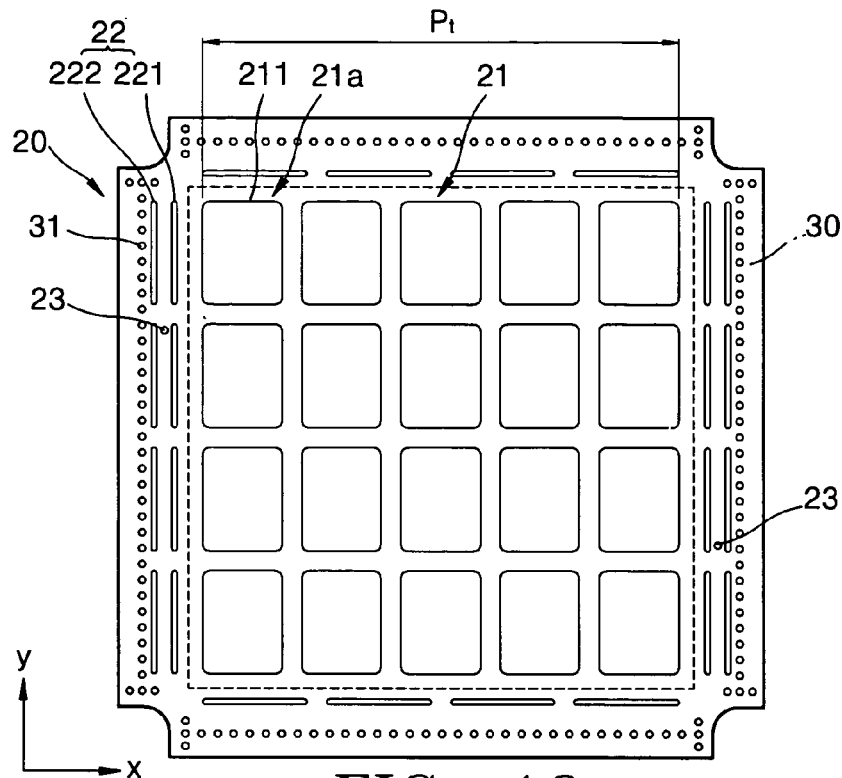

As shown in FIG. 17, the second dummy apertures 22 can be equally applied to the case where the main apertures 211 of each of the mask units 21 are formed in a lattice pattern. However, because the main apertures 211 have a lattice pattern, a tension in the y-axis direction as well as a tension in the x-axis direction adversely affects the accuracy of the total pitch Pt, so second dummy apertures 22 are also formed adjacent to the main apertures located at the outermost sides in the y-axis direction. The way of installing the second dummy apertures 22 as in FIG. 17 is also applied to an evaporation mask 20 of FIG. 18 including open mask units 21, each formed of a single main aperture 211.

Figure 19:
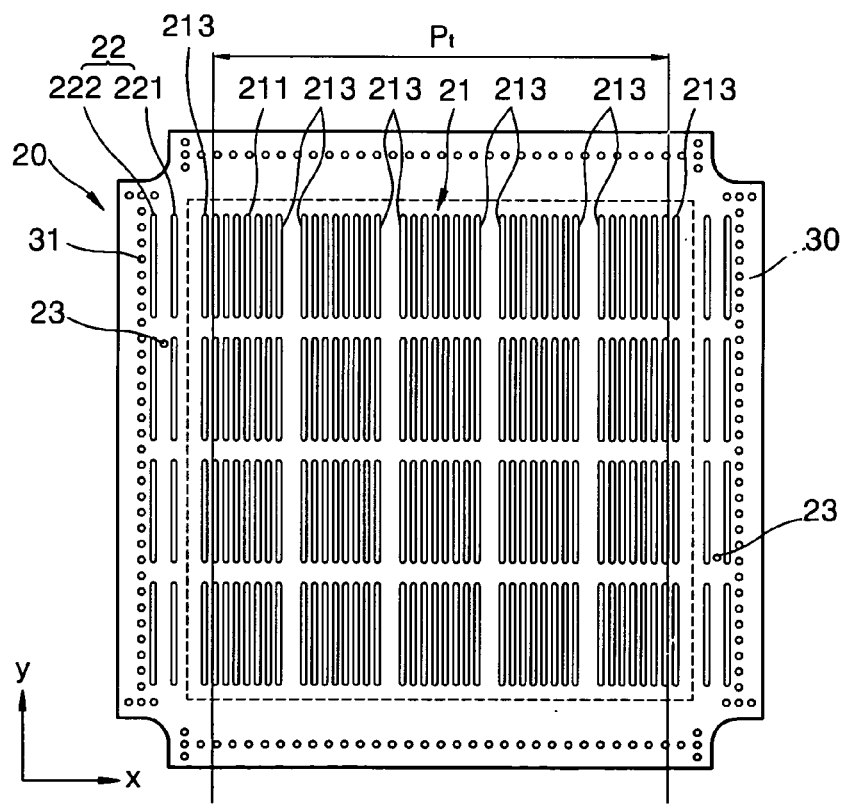

Since the evaporation mask 20 having the second dummy apertures 22 described with reference to FIGS. 14 through 18 does not include the first dummy apertures 213, the total pitch corresponds to the interval between the outermost main apertures in the outermost mask units. However, the evaporation mask 20 according to the present invention is not limited to the above determination of the length of the total pitch, but can be formed of a combination of the first dummy apertures 213 and the second dummy apertures 22 as shown in FIG. 19. Here, the combination of the first and second dummy apertures 213 and 22, respectively, may be a combination of all of the above-described embodiments.

In the evaporation mask 20 of FIG. 19, having the first and second dummy apertures 213 and 22, respectively, each of the mask units 21 prevents deformation of its main apertures forming an effective deposition area and improves the accuracy of the total pitch. Thus, highly accurate patterning can be achieved.

Figure 20:
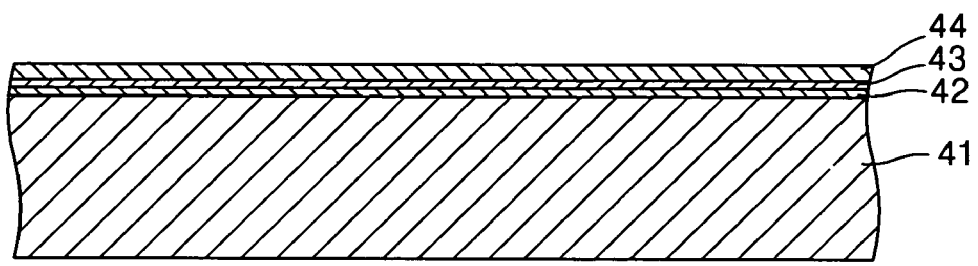
FIGS. 20 through 29 are views for illustrating a method of manufacturing an organic electroluminescent (EL) device, according to the present invention.

A method of manufacturing an organic EL device using the above-described evaporation mask 20 according to the present invention will now be described with reference to FIGS. 20 through 30. Referring to FIG. 20, first, a transparent conductive film 43 and a metal conductive film 44 are sequentially stacked on a transparent substrate 41. The transparent conductive film 43 may be formed of ITO, and the metal conductive film 44 may be formed of chrome (Cr). The substrate 41 may be formed of transparent glass, plastic, or the like. Before the transparent conductive film 43 and the metal conductive film 44 are formed on the substrate 41, a buffer layer 42 may be formed to provide a smooth substrate and prevent penetration of impure atoms. The buffer layer 42 may be formed of $SiO_2$. The substrate 41 may be large enough to form at least two organic EL devices thereon through a single process.

Figure 21:
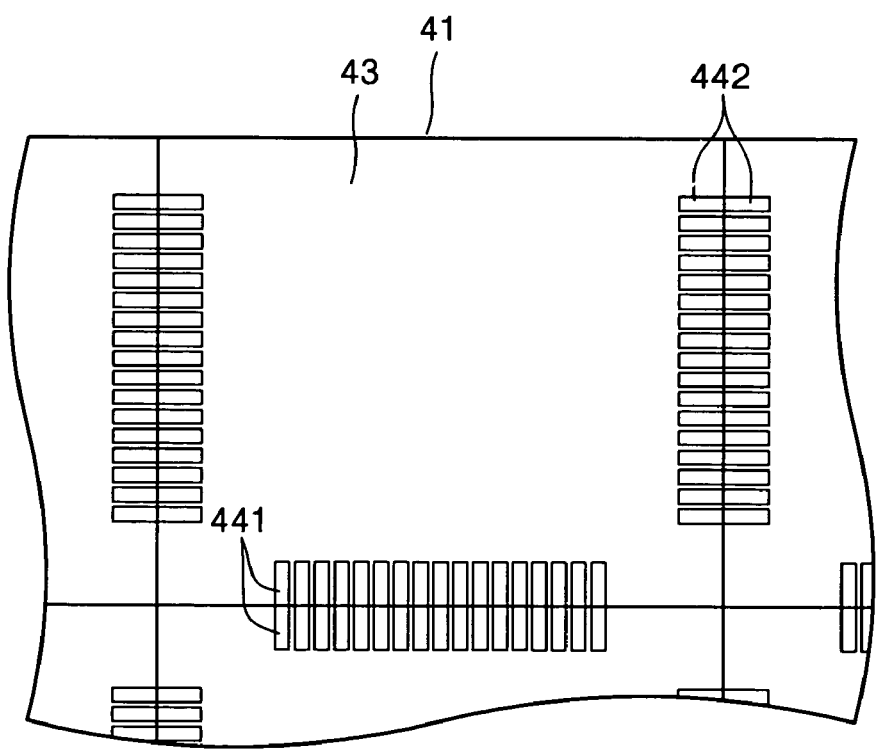

Next, as shown in FIG. 21, external electrode terminals 441 and 442, which may serve as first and second electrode terminals, respectively, are formed by processing the metal conductive film 44 formed on the upper surface of the substrate 41. FIG. 21 refers to the case where a plurality of organic EL devices are manufactured in a single process. However, for convenience of explanation, the manufacture of a single organic EL device will now be described by cutting off an organic EL device from the plurality of EL devices as shown in FIG. 21.

Figure 22A:
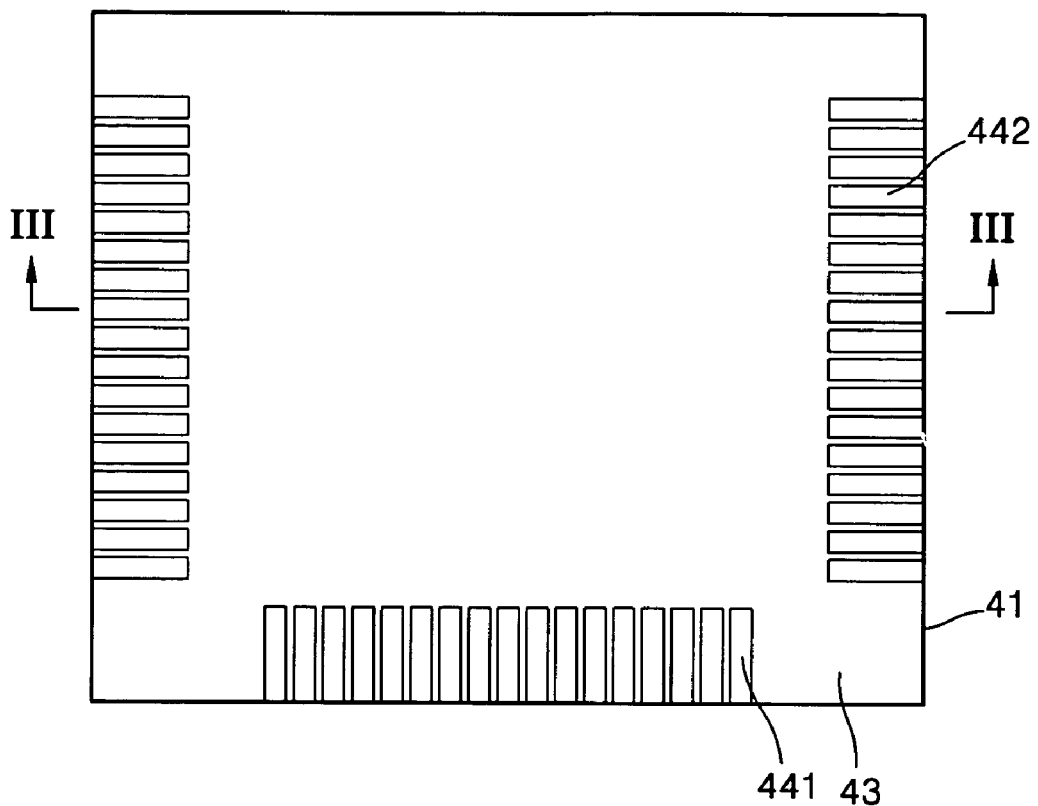
Figure 22B:
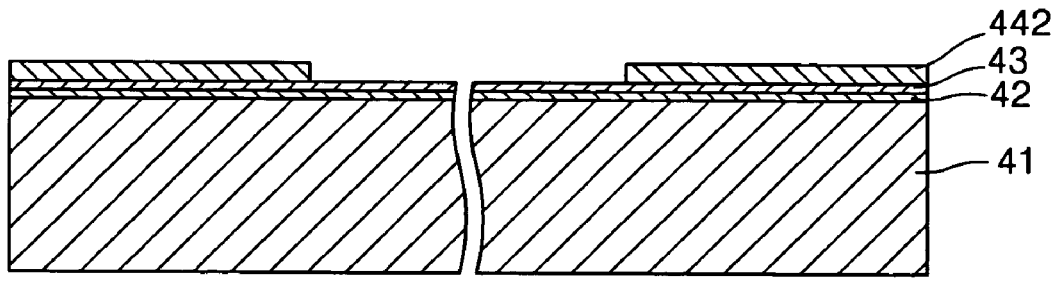

FIG. 22A refers to an organic EL device of FIG. 21, and FIG. 22B is a cross-section taken along line III-III of FIG. 22A. As shown in FIGS. 22A and 22B, the external electrode terminals 441 and 442 are the basis of the formation of the first and second electrode terminals 51 and 52 of FIG. 23A, and the transparent conductive film 43 is partially exposed on the substrate 41.

Figure 23A:
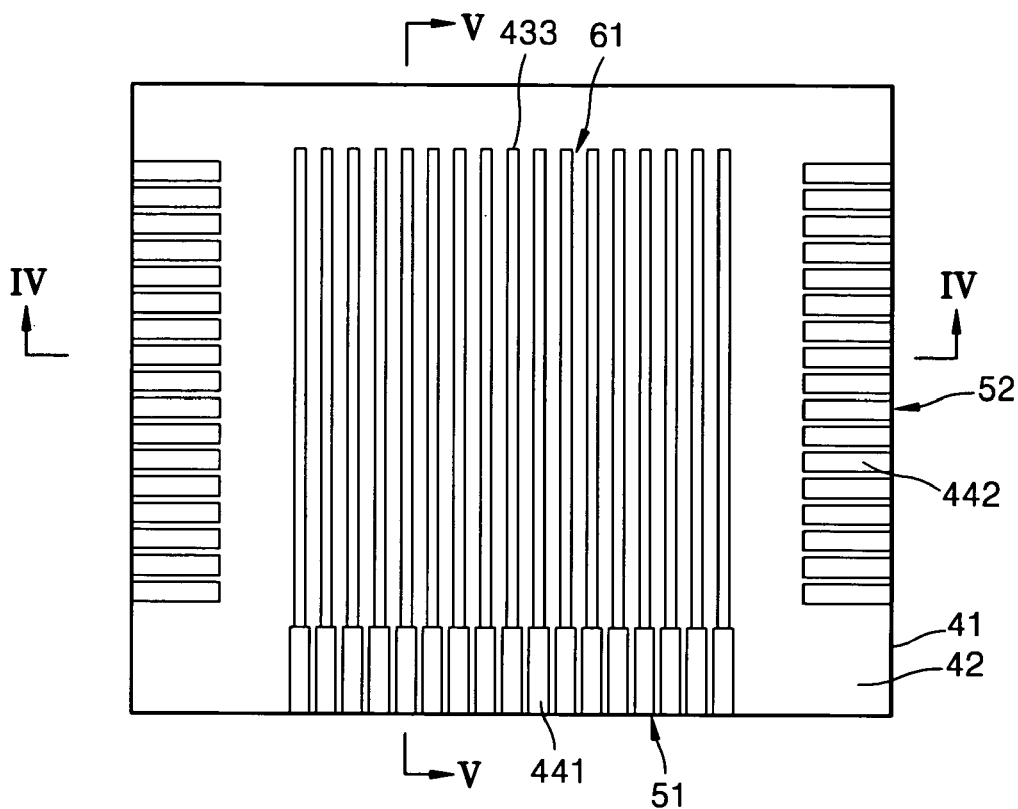
Figure 23B:
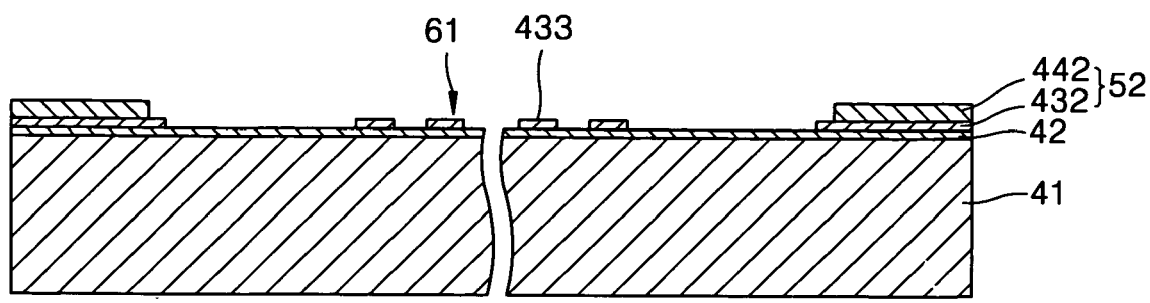
Figure 23C:
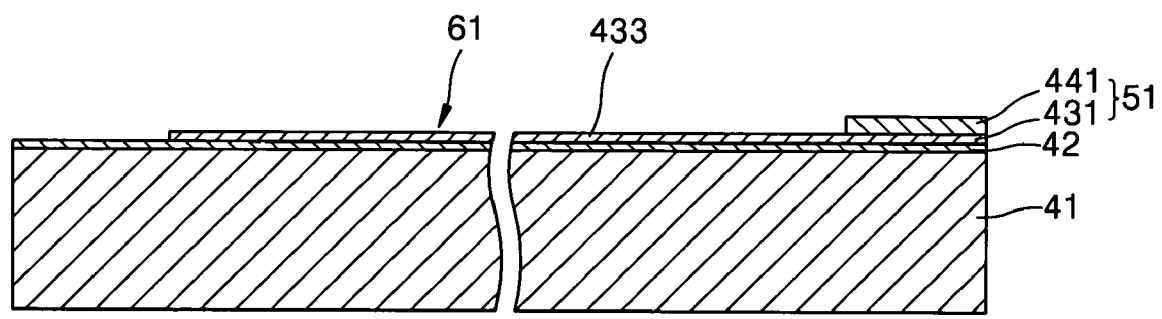

Thereafter, as shown in FIGS. 23A through 23C, internal electrode terminals 431 and 432 for the first and second electrodes 51 and 52 and a predetermined pattern of transparent conductive lines 433 are formed by patterning the exposed portion of the transparent conductive film 43 on the substrate 41. The transparent conductive lines 433 are connected to the first electrode terminals 51 and serve as first electrode lines 61. FIG. 23B is a cross-section taken along line IV-IV of FIG. 23A, and FIG. 23C is a cross-section taken along line V-V of FIG. 23A. The patterning of the transparent conductive film 43 may be achieved by photolithography.

Figure 24A:
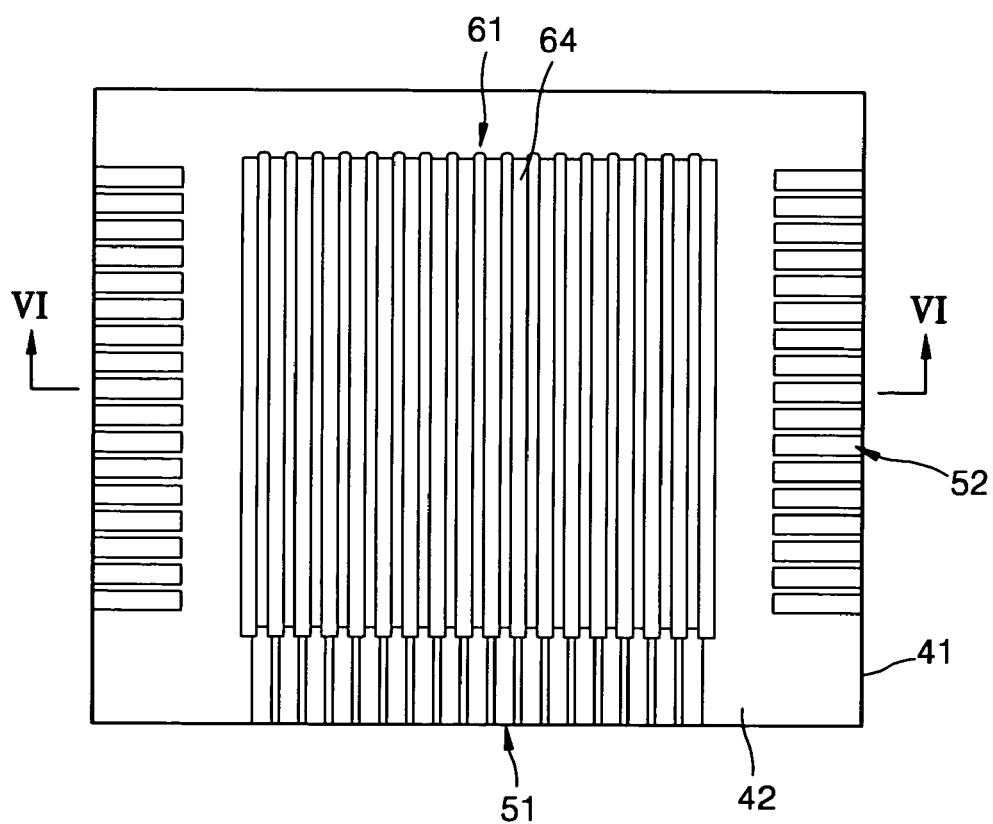
Figure 24B:
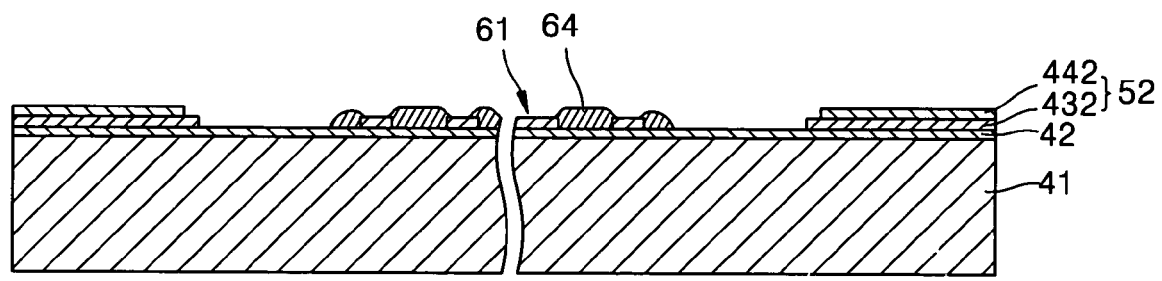

Next, as shown in FIGS. 24A and 24B, an inter-insulator 64 is formed between adjacent first electrode lines 61. FIG. 24B is a cross-section taken along line VI-VI of FIG. 24A. The inter-insulator 64 may be formed of photoresist, photosensitive polyimide, or the like using a photolithography method or the like.

Although not shown in the drawings, at the same time the inter-insulator 64 is formed, a shielding wall may be further formed inside and outside a place to be coated with an adhesive agent so as to seal up a cap, and an outer-insulator may be formed between the first electrode line 61 and the second electrode terminal 52. As described later, the outer-insulator is formed to prevent problems such as disconnection due to the step difference between second electrode lines and the second electrode terminals 52 upon formation of the second electrode lines. A buffer layer may be further formed below the outer-insulator by processing the transparent conductive film 43 to improve the adhesive strength between the outer-insulator and a substrate. Separators may be simultaneously formed to form an organic EL film and a pattern of second electrode lines. Partitions for preventing the organic EL film from being damaged may be formed simultaneously. Shielding portions may be formed simultaneously on the place to be coated with an adhesive agent.

Figure 25:
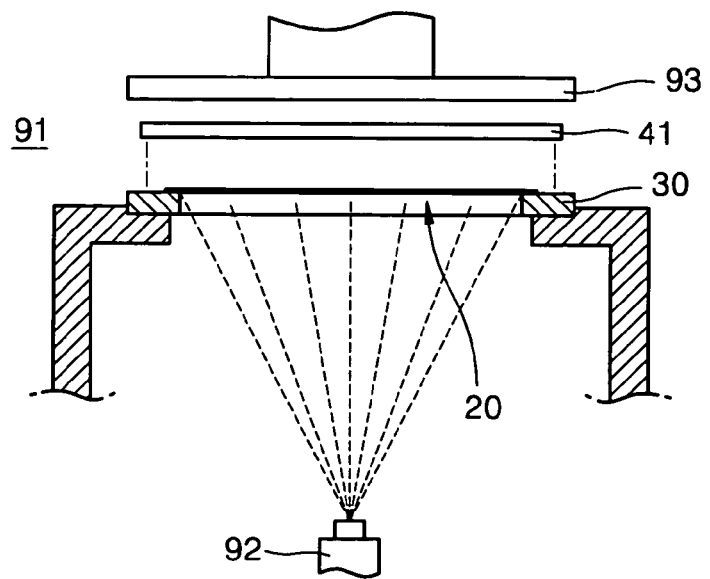

Then, an organic film is deposited using an evaporation apparatus shown in FIG. 25. In the evaporation apparatus of FIG. 25, an evaporation source 92 for evaporating an organic material is installed within a chamber 91 in a vacuum state, and the evaporation mask 20 supported by the mask frame 30 is installed over the evaporation source 92. As described above, the substrate 41 having first electrode lines and an inter-insulator formed thereon is mounted over the evaporation mask 20. A magnet unit 93 is closely installed over the substrate 41.

Figure 26A:
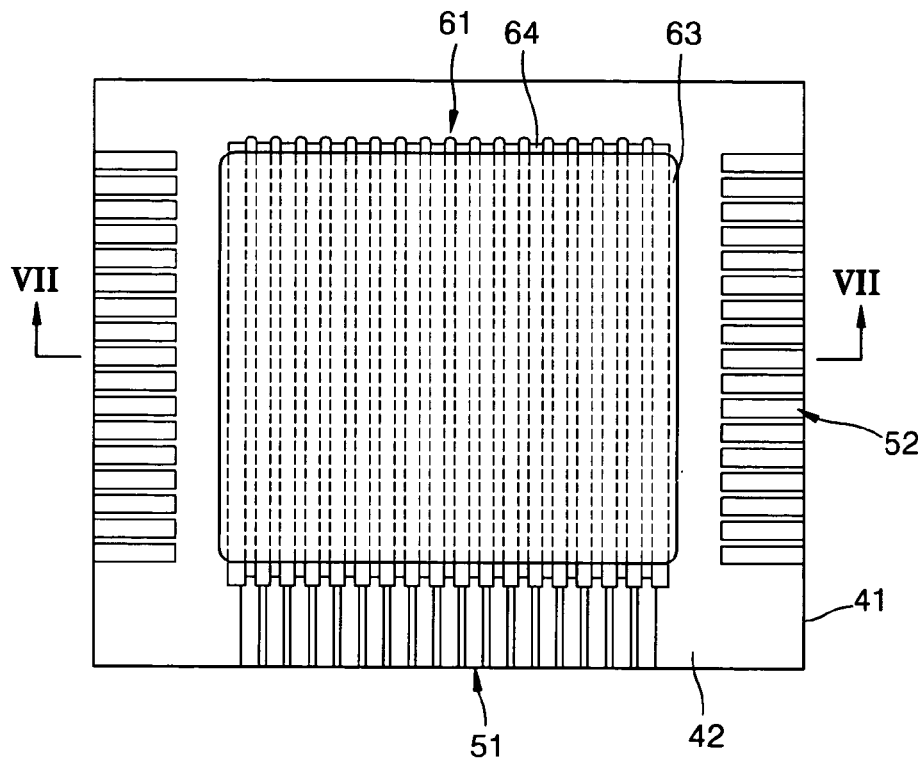
Figure 26B:
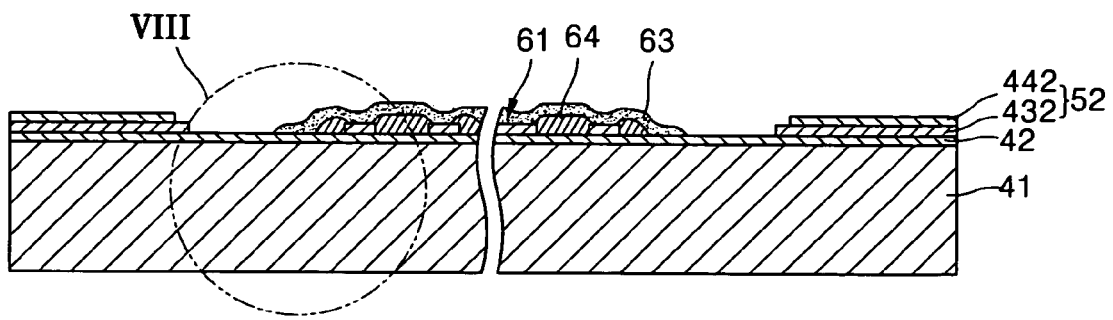
Figure 26C:
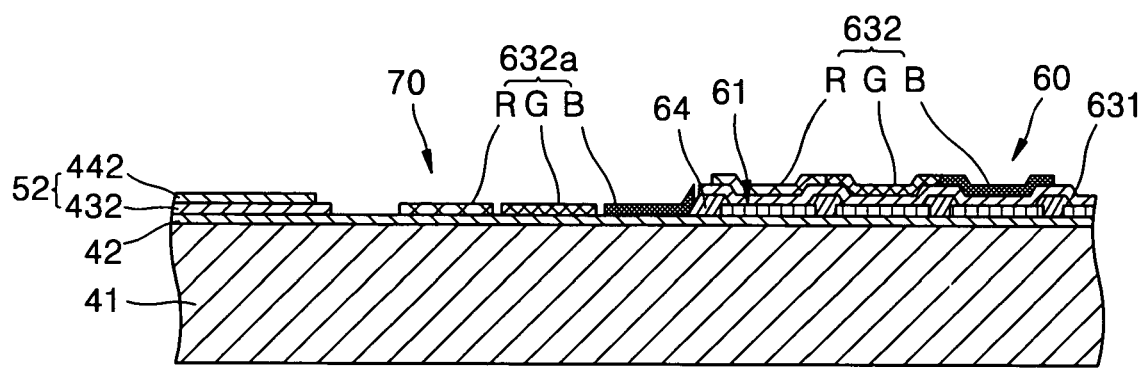

As shown in FIGS. 26A through 26C, an organic film 63 is deposited using an evaporation apparatus as shown in FIG. 25. The organic film 63 can be any organic film used in an organic EL device, and can be formed by stacking a hole transport layer, an organic luminescent layer, an electron transport layer, and the like to form a single or complex structure. The organic film 63 can be made of various organic materials including copper phthalocyanine (CuPc), N, N'-Di (naphthalene-1-yl)-N, N'-diphenyl-benzidine (NPB), and tris-8-hydroxyquinoline aluminum (Alq3). In the case of full color organic EL devices, the organic film 63 can be formed in various patterns such that the patterned organic luminescent layer corresponds to the color of each pixel.

The organic film 63 may be formed after the evaporation mask 20 is mounted on the evaporation apparatus of FIG. 25. Here, the evaporation mask 20 may be the evaporation mask 20 according to any of the embodiments of the present invention described with reference to FIGS. 4 through 19.

In other words, as described above with reference to FIGS. 4 through 13, the evaporation mask 20 having the main apertures 211 and the first dummy apertures 213 can be used to form an organic film. Here, the first dummy apertures 213 are formed adjacent to the outermost main apertures 211a in a direction in which tension is applied, i.e., in a direction perpendicular to the direction of the length of the main apertures 211. Also, as described above with reference to FIGS. 14 through 19, the evaporation mask 20 having the second dummy apertures 22, included in at least two mask units for forming an organic EL device, can be used to form an organic film. Here, the second dummy apertures 22 are formed outside the mask units, adjacent to mask units in a direction in which tension is applied, i.e., in a direction perpendicular to the direction of the length of the main apertures 211. Furthermore, although not shown in the drawings, an evaporation mask having both the first and second dummy apertures 213 and 22, respectively, can be used to form an organic film.

As shown in FIG. 26C, a first dummy pattern area 70 is formed by the first dummy apertures 213. FIG. 26C is a partially magnified cross-section of the portion indicated by reference character VIII.

As shown in FIGS. 26A through 26C, the organic film 63 is formed by depositing a hole transport layer 631 on the first electrode lines 61 and the inter-insulators 64 and then depositing red (R), green (G), and blue (B) organic luminescent layers 632 on the hole transport layer 631 such as to form color patterns. Here, the hole transport layer 631 can be blanket deposited without patterns, and the organic luminescent layers 632 may be formed in a pattern. In FIG. 26C, the organic luminescent layers 632 having a pattern are deposited using the above-described evaporation masks according to the present invention. As described above, the R, G, and B organic luminescent layers 632, formed on the first electrode lines 61, correspond to areas where the first electrode lines intersect with the second electrode lines, and accordingly emit light in response to the application of power. Thus, the R, G, and B organic luminescent layers 632 form an effective luminescent area 60.

As shown in FIG. 26C, if the R, G, and B organic luminescent layers 632 are deposited using the evaporation mask having the first dummy apertures, dummy organic luminescent layers 632a are further deposited between the second electrode terminals 52 and the first electrode lines 61, that is, the effective luminescent area 60, through the first dummy apertures. The dummy organic luminescent layers 632a form the first dummy pattern area 70.

Figure 27:
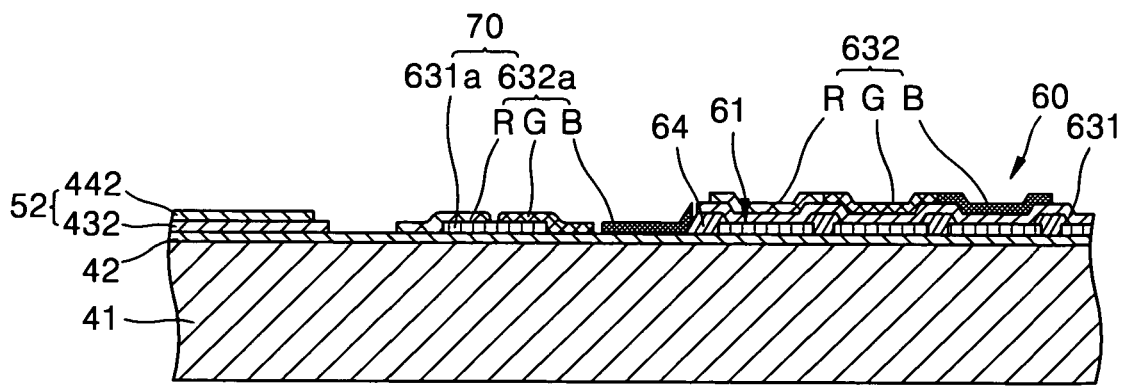

As shown in FIG. 27, if the hole transport layer 631 is deposited using an evaporation mask for forming an organic film as shown in FIG. 13, the first dummy pattern area 70 further includes a dummy hole transport layer 631a. Here, although not shown in the drawings, organic films can be deposited to the same height in the first dummy pattern area 70 by controlling the widths of the first dummy apertures 213 of FIG. 13.

As described above, if evaporation masks capable of forming the first dummy pattern area 70 have second dummy apertures, the variation of the total pitch is reduced to thus improve the accuracy of patterning of the effective luminescent area, particularly the organic luminescent layers.

Since the first dummy pattern area 70 is formed outside the effective luminescent area 60 where the first electrode lines intersect with the second electrode lines, that is, formed in an area where the first electrode lines do not intersect with the second electrode lines, the first dummy pattern area 70 corresponds to an ineffective luminescent area where no light emission occurs. The deposition using an evaporation mask capable of forming the first dummy pattern area 70 contributes to improvement of the accuracy of patterning in the effective luminescent area 60.

Figure 28A:
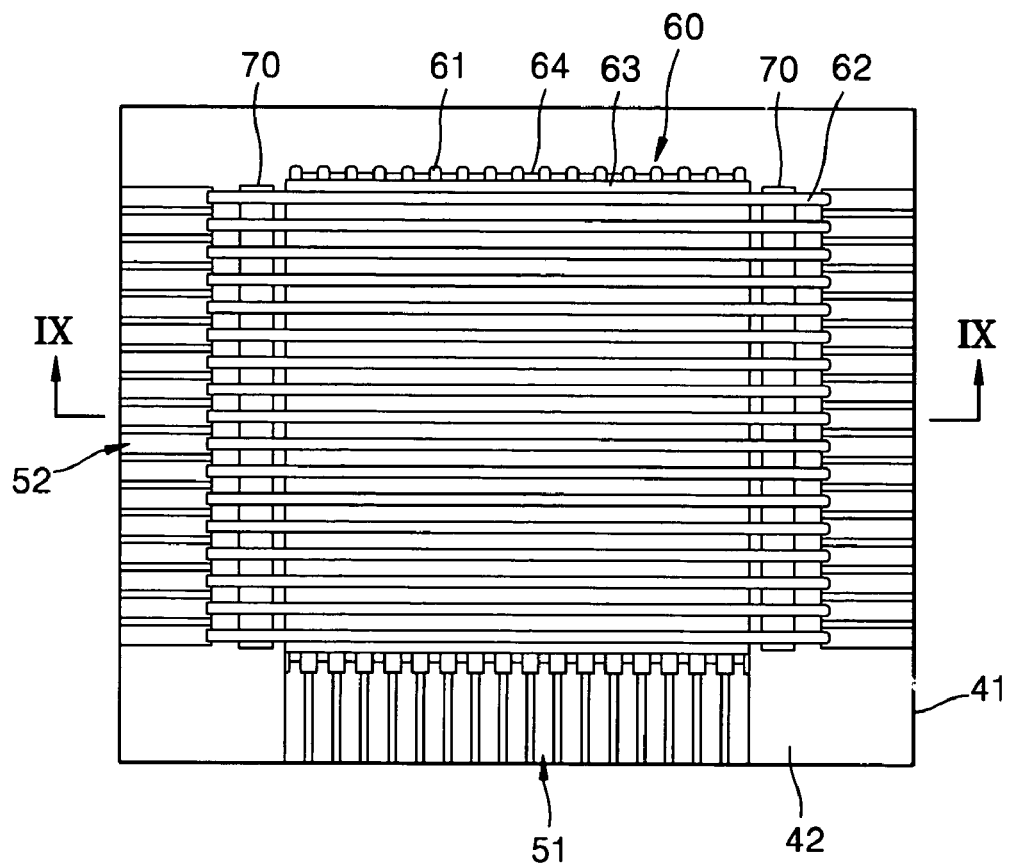
Figure 28B:
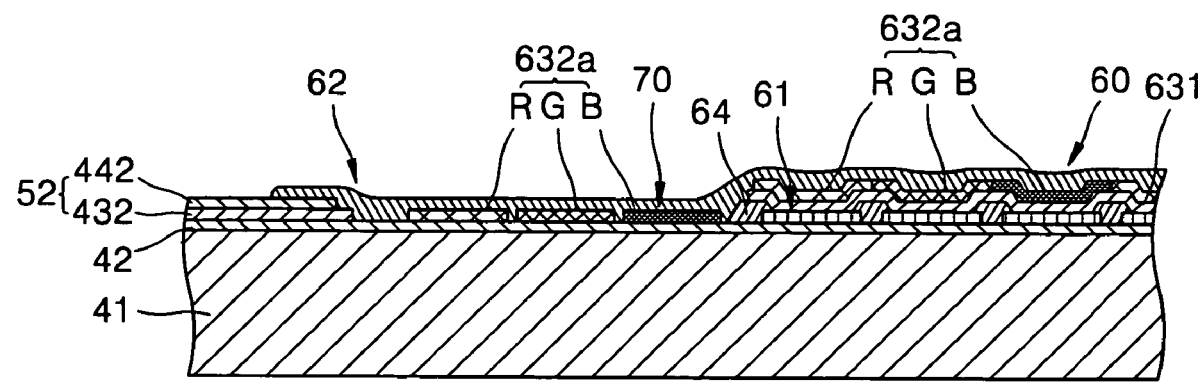

As shown in FIGS. 28A and 28B, after the organic film 63 is deposited, the second electrode lines 62 may be formed of aluminum (Al) or calcium (Ca) in a predetermined pattern on the organic film 63 such as to intersect with the first electrode lines 61. Like the deposition of the organic film 63, the second electrode lines 62 may be formed using an evaporation mask in an evaporation apparatus as shown in FIG. 25. At this time, the second electrode lines 62 may be patterned using an evaporation mask having a predetermined pattern or by previously installing a separator for forming a pattern and then performing blanket deposition on the separator.

Figure 29:
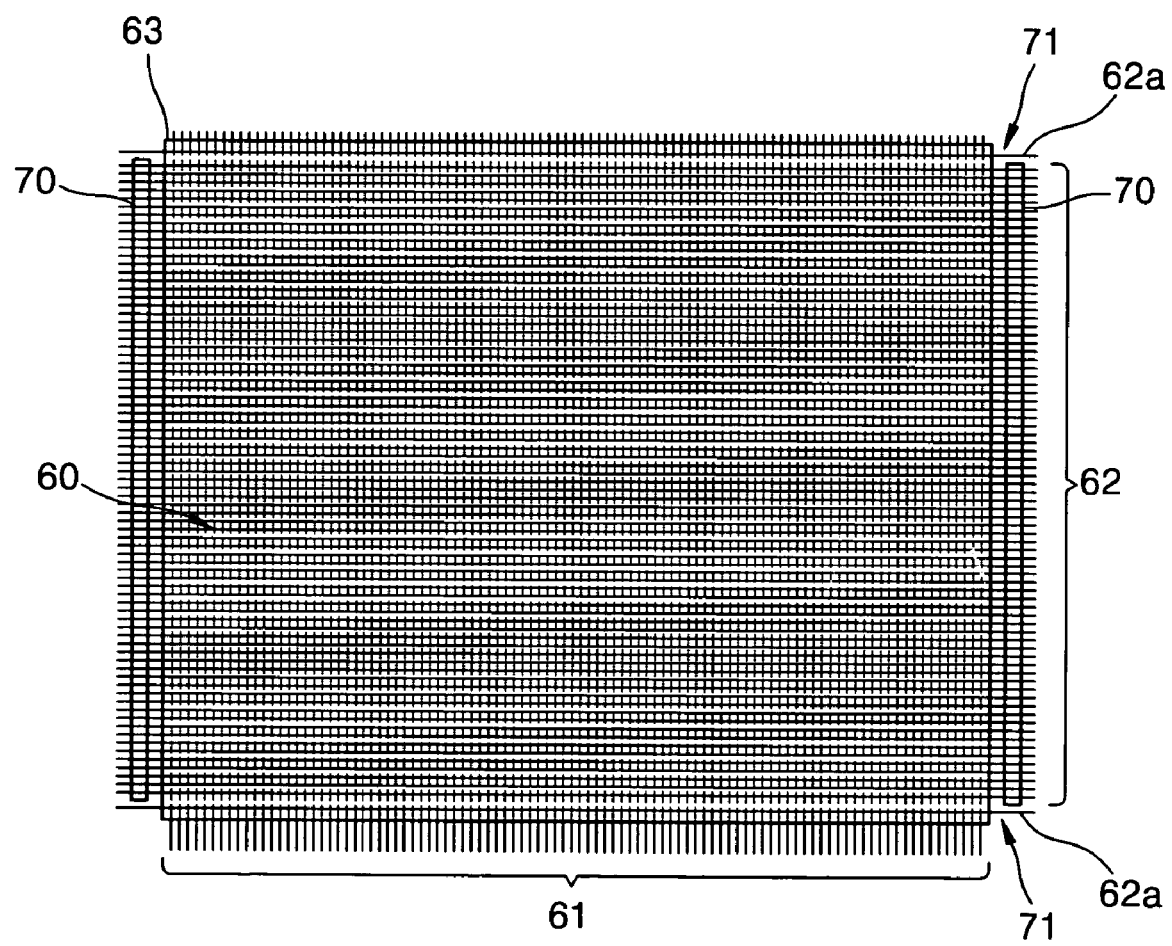

For example, as in the deposition of the organic film 63 having the organic luminescent layers 632, the second electrode lines 62 can be patterned using the evaporation mask having first and/or second dummy apertures described with reference to FIGS. 4 through 19. FIG. 29 shows an example of patterning the second electrode lines 62 using an evaporation mask. To be more specific, when the evaporation mask 20 of FIG. 4, having a pattern of main apertures 211 and the first dummy apertures 213, is used to form the second electrode lines 62, second dummy electrode lines 62a are deposited on the exterior side of the effective luminescent area 60, which is where the organic film 63 emits light due to the crossing of the first and second electrode lines 61 and 62. The second dummy electrode lines 62a form a second dummy pattern area 71. Because the second dummy electrode lines 62a are not connected to second electrode terminals which receive external power, the second dummy pattern area 71 corresponds to an ineffective luminescent area where no light emission occurs, as in the first dummy pattern area 70. As shown in FIG. 29, preferably, the second dummy electrode lines 62a may be formed outside the effective luminescent area 60 on the upper surface of the organic film 63 so as not to contact the first electrode lines 61.

A method of depositing an organic film using an evaporation mask forming an organic film and depositing second electrode lines using an evaporation mask forming second electrodes is described above. However, it is natural that the second electrode lines may be deposited using an evaporation mask according to the present invention regardless of which evaporation mask is used to deposit the organic film.

Figure 30:
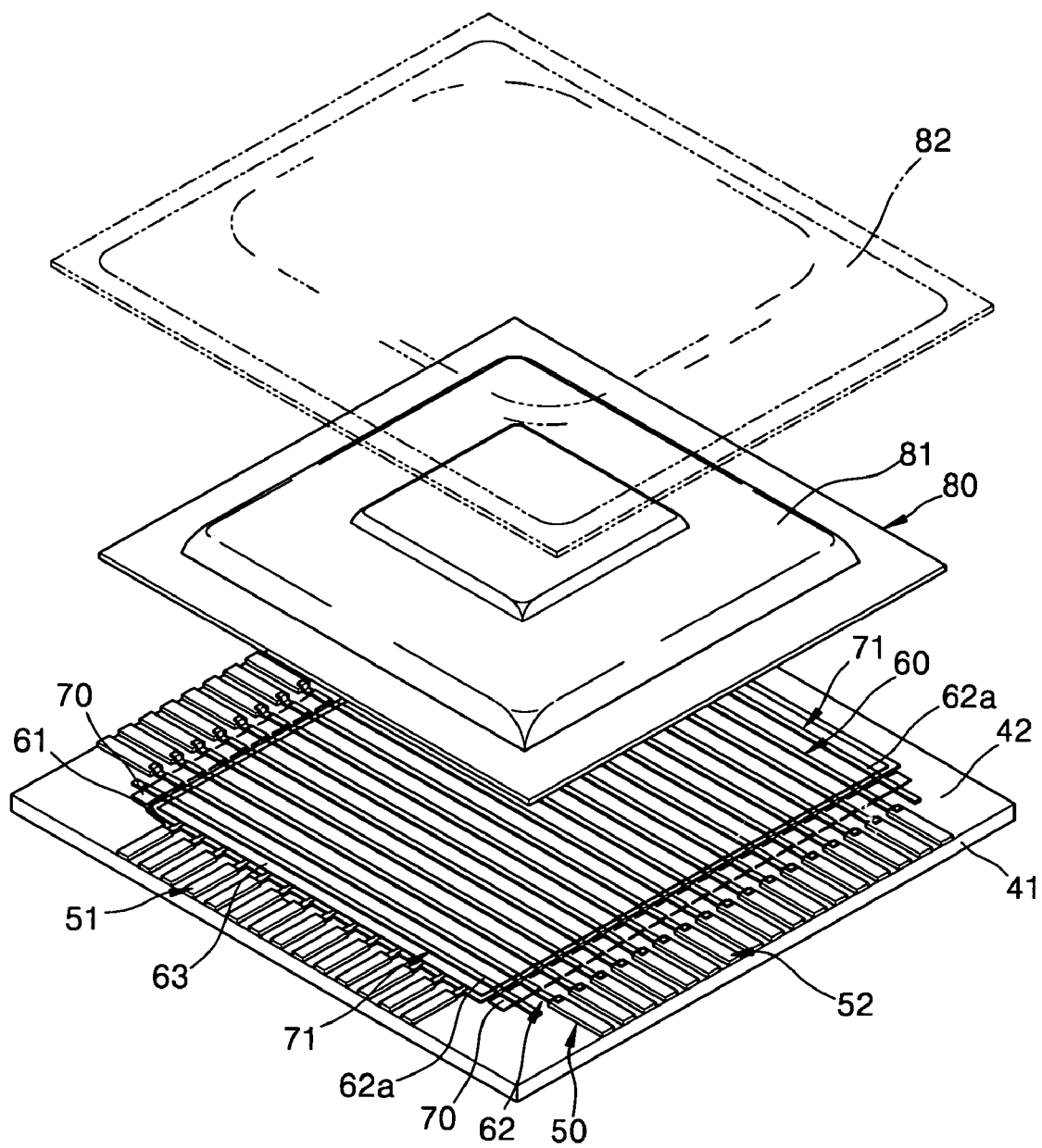
FIG. 30 is an exploded perspective view of an organic EL device according to an embodiment of the present invention.

As shown in FIG. 30, if an organic film and second electrode lines are completely formed, a sealing cap 81 is joined to the substrate 41 so as to serve as a sealing portion 80. A flexible printed circuit board 82 is connected to the first and second electrode terminals 51 and 52 exposed to the outside of the sealing portion 80, thereby completing the assembly of an organic EL device. The sealing may be achieved by any other methods applied to organic EL devices.

As shown in FIG. 30, the organic EL device according to the present invention has the effective luminescent area 60 where an organic film is formed between the first and second electrode lines 61 and 62. The organic EL device according to the present invention also includes a terminal unit 50 having the first and second electrode terminals 51 and 52, which supply power to the first and second electrode lines 61 and 62, respectively, of the effective luminescent area 60. Furthermore, the organic EL device according to the present invention may include the second dummy pattern area 71 and/or the first dummy pattern area 70, which is formed outside the effective luminescent area 60, that is, between the effective luminescent area 60 and the terminal unit 50. Since the structures and functions of the components of the organic EL device according to the present invention have been described with reference to FIGS. 20 through 29, they will not be described here in detail.

As described above, according to the present invention, an organic EL device having first and/or second dummy pattern areas in an ineffective luminescent area is manufactured using an evaporation mask having first and/or second dummy apertures, thereby improving the accuracy of patterning of an effective luminescent area where light emission occurs.

The present invention has the following effects. Firstly, the accuracy of the patterning of an effective deposition area may be improved.

Secondly, if several devices are formed at one time in a single process, the accuracy of the total pitch is improved, and thus the manufacturing yield may be improved.

Thirdly, a substrate may be accurately aligned with an evaporation mask.

Fourthly, because an organic EL device according to the present invention includes a dummy pattern area, that is, an ineffective luminescent area, an effective luminescent area where light emission occurs may have smaller pixels, resulting in a finer resolution.

Fifthly, even when tension is applied to an evaporation mask to tautly support the evaporation mask, the accuracy of the pattern of the evaporation mask is not degraded.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing an organic electroluminescent (EL) device, the method comprising:

forming first electrodes on a substrate;

disposing an evaporation mask to form an organic film over the substrate, the evaporation mask drawn taut by application of tension and having at least one mask unit, the mask unit comprising a plurality of main apertures and a plurality of first dummy apertures formed adjacent to outermost ones of the main apertures in a direction in which tension is applied to the evaporation mask;

forming the organic film comprising an effective luminescent area to cover at least the first electrodes by evaporating an organic material containing an organic luminescent material through the main apertures, and forming a first dummy pattern area outside the effective luminescent area through the first dummy apertures;

forming second electrodes on the organic film so that the effective luminescent area is formed at an area where the first and second electrodes overlap; and sealing the resulting structure, wherein at least two organic EL devices are manufactured in a single process, and the evaporation mask comprises at least two mask units, through each of which the organic film of a single organic EL device can be deposited, and a plurality of second dummy apertures outside and adjacent to outermost ones of the mask units in the direction in which tension is applied to the evaporation mask.

2. The method of claim 1, wherein at least one of the first dummy apertures is formed parallel to the main apertures, and at least another one of the first dummy apertures is formed perpendicular to the main apertures.

3. The method of claim 1, wherein the second dummy apertures of the evaporation mask are located outside the effective luminescent areas of the organic EL devices that are deposited by the outermost mask units adjacent to the second dummy apertures.

4. The method of claim 1, wherein at least one of the second dummy apertures is formed parallel to the main apertures of the mask units, and at least another one of the second dummy apertures is formed perpendicular to the main apertures.

5. A method of manufacturing an organic electroluminescent (EL) device, the method comprising:

forming first electrodes on a substrate;

disposing an evaporation mask to form an organic film over the substrate, the evaporation mask drawn taut by application of tension and having at least one mask unit, the mask unit comprising a plurality of main apertures and a plurality of first dummy apertures formed adjacent to outermost ones of the main apertures in a direction in which tension is applied to the evaporation mask;

forming the organic film comprising an effective luminescent area to cover at least the first electrodes by evaporating an organic material containing an organic luminescent material through the main apertures, and forming a first dummy pattern area outside the effective luminescent area through the first dummy apertures;

forming second electrodes on the organic film so that the effective luminescent area is formed at an area where the first and second electrodes overlap; and sealing the resulting structure, wherein in forming the second electrodes, an evaporation mask to form the second electrodes is disposed over the substrate, the evaporation mask drawn taut by application of tension and having at least one mask unit, the mask unit comprising a plurality of main apertures and a plurality of first dummy apertures formed adjacent to the outermost main apertures in the direction in which tension is applied to the evaporation mask, the second electrodes are formed on the effective luminescent area through the main apertures, and a second dummy pattern area is formed outside the effective luminescent area through the first dummy apertures, and wherein at least two organic EL devices are manufactured in a single process, and the evaporation mask comprises at least two mask units, through each of which the second electrodes of a single organic EL device can be deposited, and a plurality of second dummy apertures outside and adjacent to the outermost mask units in the direction in which tension is applied to the evaporation mask.

6. The method of claim 5, wherein at least one of the first dummy apertures is formed parallel to the main apertures, and at least another one of the first dummy apertures is formed perpendicular to the main apertures.

7. The method of claim 5, wherein the second dummy apertures are located outside the effective luminescent areas of the organic EL devices that are deposited by the outermost mask units adjacent to the second dummy apertures.

8. The method of claim 5, wherein at least one of the second dummy apertures is formed parallel to the main apertures of the mask units, and at least another one of the second dummy apertures is formed perpendicular to the main apertures.

9. A method of manufacturing an organic electroluminescent (EL) device, the method comprising:

forming first electrodes on a substrate;

disposing an evaporation mask to form an organic film over the substrate, the evaporation mask drawn taut by application of tension and having at least one mask unit, the mask unit comprising a plurality of main apertures and a plurality of first dummy apertures formed adjacent to outermost ones of the main apertures in a direction in which tension is applied to the evaporation mask;

forming the organic film comprising an effective luminescent area to cover at least the first electrodes by evaporating an organic material containing an organic luminescent material through the main apertures, and forming a first dummy pattern area outside the effective luminescent area through the first dummy apertures;

forming second electrodes on the organic film so that the effective luminescent area is formed at an area where the first and second electrodes overlap; and sealing the resulting structure, wherein at least two organic EL devices are manufactured in a single process, the second electrodes are formed using an evaporation mask drawn taut by application of tension and having at least two mask units, through which the second electrodes of the organic EL devices can be deposited, and the evaporation mask comprises a plurality of second dummy apertures outside and adjacent to outermost mask units in the direction in which tension is applied to the evaporation mask.

10. The method of claim 9, wherein the second dummy apertures are located outside the effective luminescent areas of the organic EL devices that are deposited by the outermost mask units adjacent to the second dummy apertures.

11. The method of claim 9, wherein at least one of the second dummy apertures is formed parallel to the main apertures of the mask units, and at least another one of the second dummy apertures is formed perpendicular to the main apertures.

12. A method of manufacturing an organic EL device, the method comprising:
- forming first electrodes for an organic EL device on a substrate;
- disposing an evaporation mask to form an organic film over the substrate, the evaporation mask drawn taut by application of tension and including at least two mask units each comprising a plurality of main apertures and a plurality of second dummy apertures formed outside and adjacent to outermost ones of the mask units in a direction in which tension is applied to the evaporation mask;
- forming the organic film comprising an effective luminescent area to cover at least the first electrodes by evaporating an organic material containing an organic luminescent material through the main apertures of each of the mask units;
- forming second electrodes on the organic film so that the effective luminescent area is formed at an area where the first and second electrodes overlap; and
- sealing the resulting structure.

13. The method of claim 12, wherein in forming the second electrodes, an evaporation mask to form the second electrodes is disposed over the substrate, the evaporation mask drawn taut by application of tension and including at least two mask units, the mask units each comprising a plurality of main apertures and a plurality of first dummy apertures formed adjacent to the outermost main apertures in the direction in which tension is applied to the evaporation mask, the second electrodes are formed on each of the effective luminescent areas through the main apertures, and a second dummy pattern area is formed outside each of the effective luminescent areas through the first dummy apertures.

14. The method of claim 13, wherein at least one of the first dummy apertures is formed parallel to the main apertures, and at least another one of the first dummy apertures is formed perpendicular to the main apertures.

15. The method of claim 13, wherein the evaporation mask comprises a plurality of second dummy apertures outside and adjacent to the outermost mask units in the direction in which tension is applied to the evaporation mask.

16. The method of claim 15, wherein the second dummy apertures of the evaporation mask are located outside the effective luminescent areas of the organic EL devices that are deposited by the outermost mask units adjacent to the second dummy apertures.

17. The method of claim 15, wherein at least one of the second dummy apertures is formed parallel to the main apertures of the mask units, and at least another one of the second dummy apertures is formed perpendicular to the main apertures.

18. A method of manufacturing an organic EL device, the method comprising:
- forming first electrodes on a substrate in a predetermined pattern;
- forming an organic film comprising an effective luminescent area to cover at least the first electrodes by evaporating an organic material containing an organic luminescent material;
- disposing an evaporation mask to form second electrodes over the organic film, the evaporation mask drawn taut by application of tension and comprising a plurality of main apertures and a plurality of first dummy apertures formed adjacent to outermost ones of the main apertures in a direction in which tension is applied to the evaporation mask;
- forming the second electrodes through the main apertures so that the effective luminescent area is formed at an area where the first and second electrodes overlap, and forming a second dummy pattern area outside the effective luminescent area through the first dummy apertures; and
- sealing the resulting structure,
- wherein at least two organic EL devices are manufactured in a single process, and the evaporation mask comprises at least two mask units, through each of which the second electrodes of a single organic EL device can be deposited, and a plurality of second dummy apertures outside and adjacent to outermost ones of the mask units in the direction in which tension is applied to the evaporation mask.

19. The method of claim 18, wherein at least one of the first dummy apertures is formed parallel to the main apertures, and at least another one of the first dummy apertures is formed perpendicular to the main apertures.

20. The method of claim 18, wherein the second dummy apertures of the evaporation mask are located outside the effective luminescent areas of the organic EL devices that are deposited by the outermost mask units adjacent to the second dummy apertures.

21. The method of claim 18, wherein at least one of the second dummy apertures is formed parallel to the main apertures of the mask units, and at least another one of the second dummy apertures is formed perpendicular to the main apertures.

* * * * *